US008809921B2

(12) United States Patent
Yamada et al.

(10) Patent No.: US 8,809,921 B2
(45) Date of Patent: Aug. 19, 2014

(54) SOLID-STATE IMAGING APPARATUS, METHOD OF MANUFACTURING SAME, AND ELECTRONIC APPARATUS

(75) Inventors: Akihiro Yamada, Kanagawa (JP); Atsuhiko Yamamoto, Kanagawa (JP); Hideo Kido, Kanagawa (JP)

(73) Assignee: Sony Corporation, Tokyo (JP)

( * ) Notice: Subject to any disclaimer, the term of this patent is extended or adjusted under 35 U.S.C. 154(b) by 652 days.

(21) Appl. No.: 12/926,998

(22) Filed: Dec. 22, 2010

(65) Prior Publication Data

US 2011/0180860 A1 Jul. 28, 2011

(30) Foreign Application Priority Data

Jan. 27, 2010 (JP) ................... 2010-016000

(51) Int. Cl.
*H01L 31/113* (2006.01)
*H01L 31/18* (2006.01)

(52) U.S. Cl.
USPC ........... 257/291; 257/219; 257/227; 257/230; 257/233; 257/290; 257/292; 257/E31.001; 257/E31.085

(58) Field of Classification Search
CPC ...................... H01L 27/1461; H01L 27/14616; H01L 27/1463; H01L 27/14689; H01L 31/103
USPC .......... 257/233, 291, 292, 219, 227, 230, 290
See application file for complete search history.

(56) References Cited

U.S. PATENT DOCUMENTS

| | | | |
|---|---|---|---|
| 6,521,925 B1 | 2/2003 | Mori et al. | |
| 7,749,798 B2 * | 7/2010 | Rhodes et al. | 438/75 |
| 8,357,984 B2 * | 1/2013 | Mao et al. | 257/447 |
| 2003/0025160 A1 | 2/2003 | Suzuki et al. | |
| 2003/0030083 A1 * | 2/2003 | Lee et al. | 257/292 |
| 2006/0284274 A1 * | 12/2006 | Lee et al. | 257/431 |
| 2007/0128954 A1 | 6/2007 | Itonaga | |
| 2008/0197387 A1 | 8/2008 | Itonaga et al. | |
| 2008/0296645 A1 | 12/2008 | Itonaga | |
| 2010/0187581 A1 * | 7/2010 | Shinohara et al. | 257/292 |

FOREIGN PATENT DOCUMENTS

| | | |
|---|---|---|
| JP | 2000-286405 | 10/2000 |
| JP | 2003-031785 A | 1/2003 |
| JP | 2006-049338 | 2/2006 |
| JP | 2007-158031 | 6/2007 |
| JP | 2008-166607 | 7/2008 |
| JP | 2008-205022 | 9/2008 |
| JP | 2009-016810 | 1/2009 |

* cited by examiner

*Primary Examiner* — Matthew W Such
*Assistant Examiner* — David Spalla
(74) *Attorney, Agent, or Firm* — Rader, Fishman & Grauer PLLC

(57) ABSTRACT

A solid-state imaging apparatus includes a plurality of pixels each including a photoelectric conversion unit and pixel transistors, which are formed on a semiconductor substrate; a floating diffusion unit in the pixel; a first-conductivity-type ion implantation area for surface pinning, which is formed over the surface on the side of the photoelectric conversion unit and the surface of the semiconductor substrate; and a second-conductivity-type ion implantation area for forming an overflow path serving as an overflow path for the floating diffusion unit, the second-conductivity-type ion implantation area being formed below the entire area of the first-conductivity-type ion implantation area. An overflow barrier is formed using the second-conductivity-type ion implantation area. A charge storage area is formed using an area in which the second-conductivity-type semiconductor area and the second-conductivity-type ion implantation area superpose each other.

16 Claims, 12 Drawing Sheets

SOLID-STATE IMAGING APPARATUS, METHOD OF MANUFACTURING SAME, AND ELECTRONIC APPARATUS

BACKGROUND OF THE INVENTION

1. Field of the Invention

The present invention relates to a solid-state imaging apparatus, a method of manufacturing the solid-state imaging apparatus, and an electronic apparatus used for, for example, a camera including the solid-state imaging apparatus.

2. Description of the Related Art

An example of a solid-state imaging apparatus is a CMOS solid-state imaging apparatus. Because CMOS solid-state imaging apparatuses have a low power-supply voltage and have low consumption of power, they are used for digital still cameras, digital video cameras, various portable terminal devices such as mobile phones with camera, printers, and the like.

CMOS solid-state imaging apparatuses are configured to include a pixel area in which a plurality of pixels constituted by a photodiode that is a photoelectric conversion unit and a plurality of pixel transistors are two-dimensionally arranged in a regular manner, and a peripheral circuit unit arranged in the area surrounding the pixel area. Peripheral circuit units include a column circuit (vertical driving unit) for propagating a signal in the column direction, and a horizontal circuit (horizontal transfer unit) for transmitting signals of each column, which are propagated by the column circuit in sequence to an output circuit, and the like. An example of the plurality of pixel transistors is a configuration using 3 transistors, namely, a transfer transistor, a reset transistor, and an amplification transistor, or using 4 transistors in which a selection transistor is added thereto.

In CMOS solid-state imaging apparatuses, when a photodiode is irradiated with an amount of light to such an extent that electric charge that is photoelectrically converted by a photodiode overflows, it is necessary to discharge the overflowing electric charge to an overflow drain. An example of an overflow mechanism is a vertical overflow structure in which a power-supply potential is set on the back surface of a semiconductor substrate, and the substrate back surface is set as an overflow drain, so that the overflowing charge is discharged toward the substrate back surface side. Furthermore, an example of a overflow mechanism is a horizontal overflow structure in which a floating diffusion unit or another power-supply potential is set as an overflow drain, so that electric charge that is overflowing from a photodiode is discharged in the horizontal direction.

FIG. 12 schematically shows the main portion of a CMOS solid-state imaging apparatus including a vertical overflow structure. In a CMOS solid-state imaging apparatus 111, a p-type semiconductor well area 113 formed on an n-type semiconductor substrate (not shown) is formed with a pixel 115 that includes a plurality of pixel transistors including a photodiode PD and a transfer transistor Tr1 that are divided by an element isolation area 114. The photodiode PD is configured to include a low concentration n-type semiconductor area 116, a high concentration n-type charge storage area 117 on the surface side thereof, and a p-type semiconductor area 118 on the surface of the n-type charge storage area 117. The p-type semiconductor area 118 has a comparatively high concentration and also serves to suppress dark current. A transfer gate electrode 121 is formed between the photodiode PD and an n-type floating diffusion unit FD with a gate insulating film 119 in between, thereby forming the transfer transistor Tr1. Reference numeral 122 denotes a side wall formed on the side surface of the transfer gate electrode 121.

In the CMOS solid-state imaging apparatus 111, a substrate potential (power-supply potential) is applied to the back surface of a semiconductor substrate, and the substrate back surface operates as an overflow drain and a p-type semiconductor area provided below a photodiode PD operates as an overflow barrier. Overflowing charge is discharged in a vertical direction on the back surface side of the substrate, as indicated by an arrow 123.

FIG. 13 schematically shows the main portion of a CMOS solid-state imaging apparatus having a horizontal overflow structure. In this CMOS solid-state imaging apparatus 131, in a manner similar to that described above, a p-type semiconductor well area 113 forms a pixel 115 that includes a plurality of pixel transistors including a photodiode PD and a transfer transistor Tr1 divided by the element isolation area 114. Components in FIG. 13 corresponding to those of FIG. 14 are designated with the same reference numerals, and repeated description thereof is omitted.

This CMOS solid-state imaging apparatus 131 is configured so that the floating diffusion unit FD serves as an overflow drain, and a channel potential below the transfer gate electrode 121 operates as an overflow barrier. Overflowing charge is discharged toward the floating diffusion unit side in the horizontal direction, as indicated by an arrow 133.

In the case of a CMOS solid-state imaging apparatus of a top surface irradiation type using an n-type semiconductor substrate, a vertical overflow structure can be adopted. In the vertical overflow structure, an overflow barrier is formed by ion-implanting a p-type impurity over the entire pixel area at a position deep within a substrate in the bottom part of the photodiode PD. This overflow barrier is determined by the dosage of a p-type impurity to be implanted, and the influence of manufacturing variations is small.

In comparison, in the case of a CMOS solid-state imaging apparatus of a back surface irradiation type or in the case of a CMOS solid-state imaging apparatus of a top surface irradiation type using a p-type semiconductor substrate, a device is necessary to set a power-supply potential on the substrate back surface. For this reason, usually, a horizontal overflow structure is formed. When a horizontal overflow structure is to be formed, an overflow path is formed in which a potential barrier below a transfer gate electrode is lowered, and electric charge leaked from the photodiode PD passes below the transfer gate electrode and flows into the floating diffusion unit FD. It is common practice that, at the same time, the floating diffusion unit FD be formed as an overflow drain.

In Japanese Unexamined Patent Application Publication Nos. 2006-49338, 2003-31785, 2007-158031, 2008-166607, 2008-205022, 2009-016810, and 2000-286405, related art of a CMOS solid-state imaging apparatus is disclosed. Japanese Unexamined Patent Application Publication No. 2006-49338 discloses a configuration in which a photodiode is extended to below a floating diffusion unit. Japanese Unexamined Patent Application Publication No. 2003-31785 discloses a configuration in which a CMOS solid-state imaging apparatus of a back surface irradiation type. Japanese Unexamined Patent Application Publication Nos. 2007-158031 and 2008-166607 disclose a configuration in which a side wall is formed on the side surface of a gate electrode in a pixel transistor of a CMOS solid-state imaging apparatus. Japanese Unexamined Patent Application Publication No. 2008-205022 discloses a configuration in which an element isolation area is formed in the surroundings of a floating diffusion unit in a CMOS solid-state imaging apparatus. Japanese Unexamined Patent Application Publication No. 2009-016810 discloses a configuration in which a pixel transistor of a CMOS solid-state imaging apparatus is separated in a diffusion layer or in an element isolation area of a shallow trench isolation (STI) structure. Japanese Unexamined Patent Application Publication No. 2000-286405 discloses a configuration in which an n-type semiconductor area is formed on the side of a photodiode of a gate electrode of a transfer transistor in a CMOS solid-state imaging apparatus.

SUMMARY OF THE INVENTION

When a horizontal overflow structure is to be formed, a CMOS solid-state imaging apparatus 141 shown in FIG. 14 has a configuration in which an overflow barrier below a transfer gate electrode is lowered. In this CMOS solid-state imaging apparatus 141, a configuration is adopted in which the area surrounding a transfer gate electrode 121 is covered with a mask (not shown), and an ion implantation area (low concentration n-type semiconductor area) 142 using an n-type impurity is formed below the transfer gate electrode 121. In FIG. 14, the remaining configuration is the same as that of FIG. 13, and thus repeated description thereof is omitted. In order to form an overflow path below the transfer gate electrode 121, in the manner described above, it is necessary to lower the potential barrier below the transfer gate electrode 121 so that electric charge overflowing from the photodiode PD flows into the floating diffusion unit FD.

For this purpose, it is necessary to increase the dosage of an ion implantation area 142 shown in FIG. 14 to a certain degree. However, when ion-implanting an n-type impurity with a mask in between, variations occur in the formation of an overflow barrier below the transfer gate electrode 121. A possible factor responsible for these manufacturing variations is the influence of mask misalignment. It is understood that since the dosage of the n-type impurity to be ion-implanted below the transfer gate electrode has a comparatively large and local distribution, the influence of mask misalignment is increased, and control becomes difficult.

The overflow barrier being varied has a large influence on pixel characteristics. The overflow barrier determines the amount of electric charge to be stored in the photodiode PD, and variations in the overflow barrier become variations in the amount of saturated charge.

According to an embodiment of the present invention, there is provided a solid-state imaging apparatus in which variations in an overflow barrier are suppressed and pixel characteristics are improved, and a method of manufacturing the solid-state imaging apparatus in a CMOS solid-state imaging apparatus having a horizontal overflow structure. According to another embodiment of the present invention, there is provided an electronic apparatus including the solid-state imaging apparatus.

A solid-state imaging apparatus according to an embodiment of the present invention includes a plurality of pixels each including a photoelectric conversion unit and pixel transistors, the plurality of pixels being formed on a semiconductor substrate; and a floating diffusion unit in the pixel. The solid-state imaging apparatus further includes a first-conductivity-type ion implantation area for surface pinning, which is formed over the entirety of the surface of the photoelectric conversion unit in the pixel and the surface of the semiconductor substrate below a transfer gate electrode of a transfer transistor among the pixel transistors. The solid-state imaging apparatus further includes a second-conductivity-type ion implantation area for forming an overflow path serving as an overflow path for the floating diffusion unit, the second-conductivity-type ion implantation area being formed below the entire area of the first-conductivity-type ion implantation area. An overflow barrier for forming an overflow path is formed by using the second-conductivity-type ion implantation area below the transfer gate electrode. A charge storage area is formed by using an area in which the second-conductivity-type semiconductor area in the photoelectric conversion unit and the second-conductivity-type ion implantation area for forming the overflow path superpose each other.

In the solid-state imaging apparatus according to the embodiment of the present invention, an overflow path using the second-conductivity-type ion implantation area is formed below the entire area of the first-conductivity-type ion implantation area for surface pinning, which is formed on the entirety of the surface of the photoelectric conversion unit and the surface of the semiconductor substrate below the transfer gate electrode. That is, the impurity of the second-conductivity-type ion implantation area is uniformly distributed over the entire surface of the photoelectric conversion unit and below the transfer gate electrode. As a result, the influence of mask misalignment at the time of manufacture is reduced. Furthermore, the impurity of the first-conductivity-type ion implantation area for surface pinning is also uniformly distributed over the entire surface of the photoelectric conversion unit and below the transfer gate electrode. As a result, the influence of mask misalignment at the time of manufacture is reduced. Furthermore, a charge storage area is formed in an area in which the second-conductivity-type semiconductor area of the photoelectric conversion unit and the second-conductivity-type ion implantation area serving as an overflow path superpose each other. Consequently, the ion implantation dosage of the second-conductivity-type impurity when the second-conductivity-type semiconductor area of the photoelectric conversion unit is formed is relatively reduced.

A method of manufacturing a solid-state imaging apparatus according to an embodiment of the present invention includes the step of: forming, by an ion implantation method, a first-conductivity-type semiconductor area for surface pinning, and a second-conductivity-type ion implantation area for forming an overflow path below the entire area of the first-conductivity-type ion implantation area in each pixel formation area of a semiconductor substrate. The first-conductivity-type ion implantation area for surface pinning and the second-conductivity-type ion implantation area for forming an overflow path are formed over the entire surface of the following areas. That is, in each pixel, the areas are formed on the surface of the second-conductivity-type semiconductor area of the photoelectric conversion unit, the surface of the semiconductor substrate corresponding to below the transfer gate electrode of the transfer transistor to be formed, and the surface of the semiconductor substrate corresponding to the floating diffusion unit.

The method of manufacturing a solid-state imaging apparatus further includes the steps of forming gate electrodes of the pixel transistors including a transfer transistor with a gate insulating film in between on the semiconductor substrate; and forming a floating diffusion unit by ion-implanting a second-conductivity-type impurity into the semiconductor substrate.

An overflow barrier forming an overflow path is formed by using the second-conductivity-type ion implantation area below the transfer gate electrode, and a charge storage area is formed by using an area in which the second-conductivity-type semiconductor area formed in the photoelectric conversion unit and the second-conductivity-type ion implantation area superpose each other.

In the method of manufacturing a solid-state imaging apparatus according to the embodiment of the present invention, the first-conductivity-type ion implantation area for surface pinning and the second-conductivity-type ion implantation area serving as an overflow path are formed by ion implantation in an area corresponding to the entire area from the photoelectric conversion unit to the floating diffusion unit. As a result, an overflow path can be accurately formed without being influenced by mask misalignment in an area corresponding to below the transfer gate electrode. Furthermore, the first-conductivity-type ion implantation area for surface pinning can be accurately formed without being influenced by mask misalignment. Since a charge storage area is formed in an area in which the second-conductivity-type semiconductor area of the photoelectric conversion unit and the second-conductivity-type ion implantation area for forming an overflow path superpose each other, the ion implantation dosage of the second-conductivity-type semiconductor area of the photoelectric conversion unit can be reduced.

An electronic apparatus according to an embodiment of the present invention includes a solid-state imaging apparatus; an optical system for guiding incident light to a photodiode of the solid-state imaging apparatus; and a signal processing circuit for processing an output signal of the solid-state imaging apparatus.

The solid-state imaging apparatus includes a plurality of pixels each including a photoelectric conversion unit and pixel transistors, the plurality of pixels being formed on a semiconductor substrate, and a floating diffusion unit in the pixel. The solid-state imaging apparatus further includes a first-conductivity-type ion implantation area for surface pinning, which is formed over the entirety of the surface of the photoelectric conversion unit in the pixel and the surface of the semiconductor substrate below a transfer gate electrode of a transfer transistor among the pixel transistors. The solid-state imaging apparatus further includes a second-conductivity-type ion implantation area for forming an overflow path serving as an overflow path for the floating diffusion unit, the second-conductivity-type ion implantation area being formed below the entire area of the first-conductivity-type ion implantation area. An overflow barrier forming an overflow path is formed by using the second-conductivity-type ion implantation area below the transfer gate electrode. A charge storage area is formed in an area in which the second-conductivity-type semiconductor area of the photoelectric conversion unit and the second-conductivity-type ion implantation area superpose each other.

According to the solid-state imaging apparatus in accordance with an embodiment of the present invention, it is possible to suppress variations in an overflow barrier in a horizontal overflow structure so as to improve pixel characteristics.

According to the method of manufacturing a solid-state imaging apparatus in accordance with an embodiment of the present invention, an overflow barrier of a horizontal overflow structure can be formed without being influenced by manufacturing variations, and it is possible to manufacture a solid-state imaging apparatus in which image characteristics are improved.

According to the electronic apparatus in accordance with an embodiment of the present invention, since the electronic apparatus includes a solid-state imaging apparatus of the embodiment of the present invention, it is possible to provide an electronic apparatus having high image quality and high reliability.

DESCRIPTION OF THE PREFERRED EMBODIMENTS

Embodiments of the present invention will be described below. The description will be given in the following order.
1. Example of overall configuration of MOS solid-state imaging apparatus
2. First embodiment (example of configuration of solid-state imaging apparatus and example of manufacturing solid-state imaging apparatus)
3. Second embodiment (example of configuration of solid-state imaging apparatus and example of manufacturing solid-state imaging apparatus)
4. Third embodiment (example of configuration of electronic apparatus)

1. Example of Overall Configuration of CMOS Solid-State Imaging Apparatus

Figure 1:
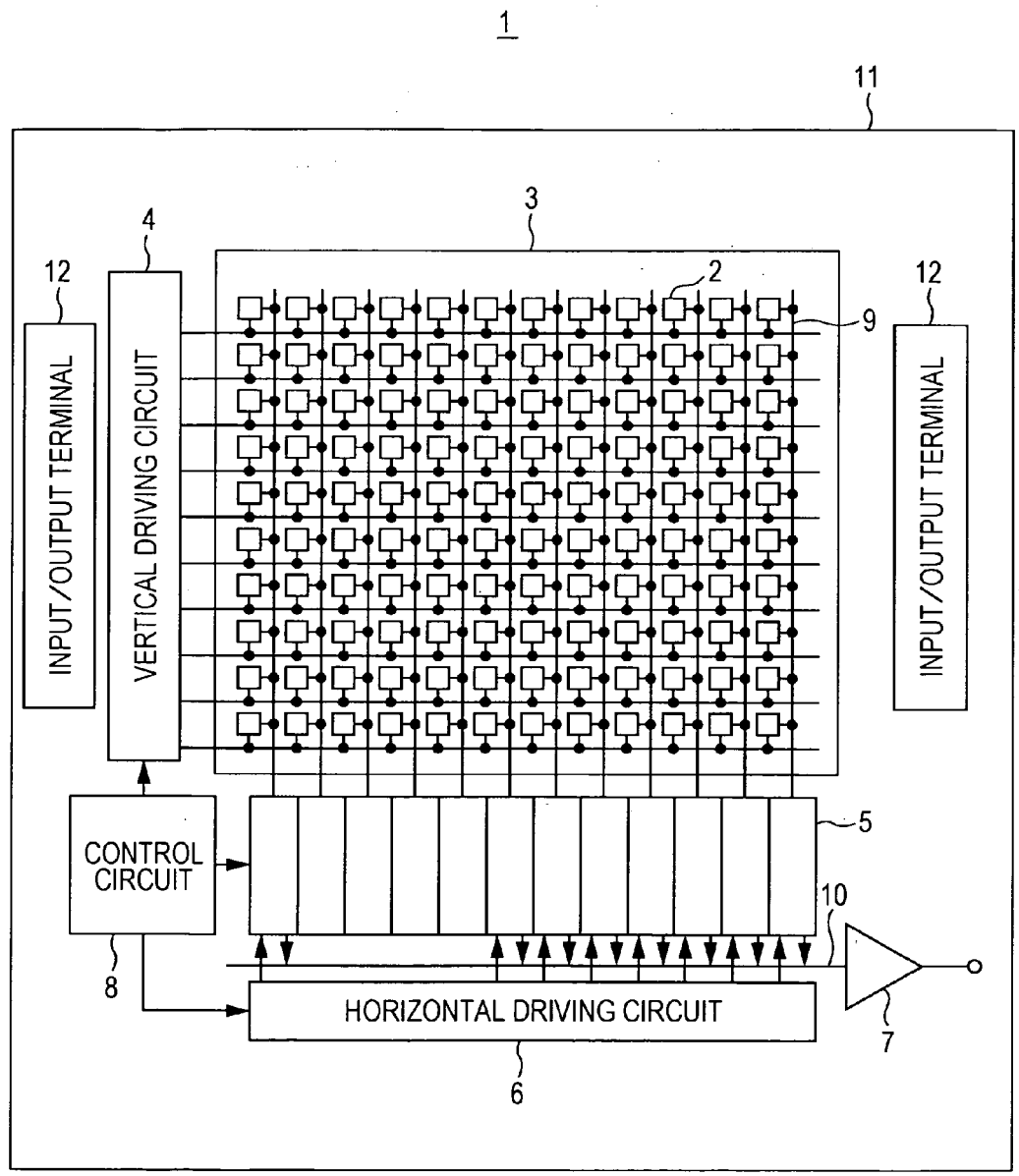
FIG. 1 is a schematic block diagram showing an example of a CMOS solid-state imaging apparatus according to an embodiment of the present invention.

FIG. 1 shows an overall configuration of an example of a MOS solid-state imaging apparatus according to each of the embodiments of the present invention. As shown in FIG. 1, a solid-state imaging apparatus 1 of this example is configured to include a pixel area (so-called image-sensing area) 3 in which a plurality of pixels 2 including a photoelectric conversion unit are two-dimensionally arranged in a regular manner on a semiconductor substrate 11, for example, a silicon substrate, and a peripheral circuit unit. As the pixel 2, a unit pixel made up of one photoelectric conversion unit and a plurality of pixel transistors can be used. Furthermore, as the pixel 2, a so-called pixel shared structure in which a plurality of photoelectric conversion units share other pixel transistors excluding the transfer transistor can be used. The plurality of pixel transistors can be constituted by, for example, 3 transistors, namely, a transfer transistor, a reset transistor, and an amplification transistor, or by 4 transistors in which a selection transistor is added thereto.

The peripheral circuit unit is configured to include a vertical driving circuit 4, a column signal processing circuit 5, a horizontal driving circuit 6, an output circuit 7, a control circuit 8, and the like.

The control circuit 8 receives an input clock and data for instructing an operation mode or the like, and also outputs data, such as the internal information of the solid-state imaging apparatus. That is, in the control circuit 8, a clock signal serving as a reference for the operation of the vertical driving circuit 4, the column signal processing circuit 5, and the horizontal driving circuit 6, and a control signal are generated on the basis of a vertical synchronization signal, a horizontal synchronization signal, and a master clock. Then, these signals are input to the vertical driving circuit 4, the column signal processing circuit 5, the horizontal driving circuit 6, and the like.

The vertical driving circuit 4 is constituted by, for example, a shift register, selects a pixel driving wiring, and supplies pulses for driving a pixel to the selected pixel driving wiring, thereby driving pixels on a row-by-row basis. That is, the vertical driving circuit 4 selects the pixels 2 of the pixel area 3 on a row-by-row basis in sequence in the vertical direction. Then, the vertical driving circuit 4 supplies, to the column signal processing circuit 5, a pixel signal based on signal charge generated on the basis of the amount of received light in the photodiode serving as, for example, a photoelectric conversion element of each pixel 2 through a vertical signal line 9.

The column signal processing circuit 5 is arranged, for example, for each column of the pixel 2, and performs signal processing, such as noise reduction, for each pixel column on a signal output from the pixel 2 for one row. That is, the column signal processing circuit 5 performs signal processing, such as correlated double sampling (CDS) for removing fixed pattern noise unique to the pixel 2, signal amplification, and AD conversion. A horizontal selection switch (not shown) is provided in the output stage of the column signal processing circuit 5 in such a manner as to be connected with a horizontal signal line 10.

The horizontal driving circuit 6 is constituted by, for example, a shift register, sequentially outputs horizontal scanning pulses so as to sequentially select the column signal processing circuits 5, and causes each of the column signal processing circuits 5 to output a pixel signal to the horizontal signal line 10.

The output circuit 7 performs signal processing on signals that are sequentially supplied through the horizontal signal line 10 from each of the column signal processing circuits 5, and outputs the signals. For example, there is a case in which only buffering is performed, or there is a case in which black level adjustment, column variation correction, and various digital signal processes are performed. The input/output terminal 12 performs transmission and reception of signals to and from the outside.

Figure 2:
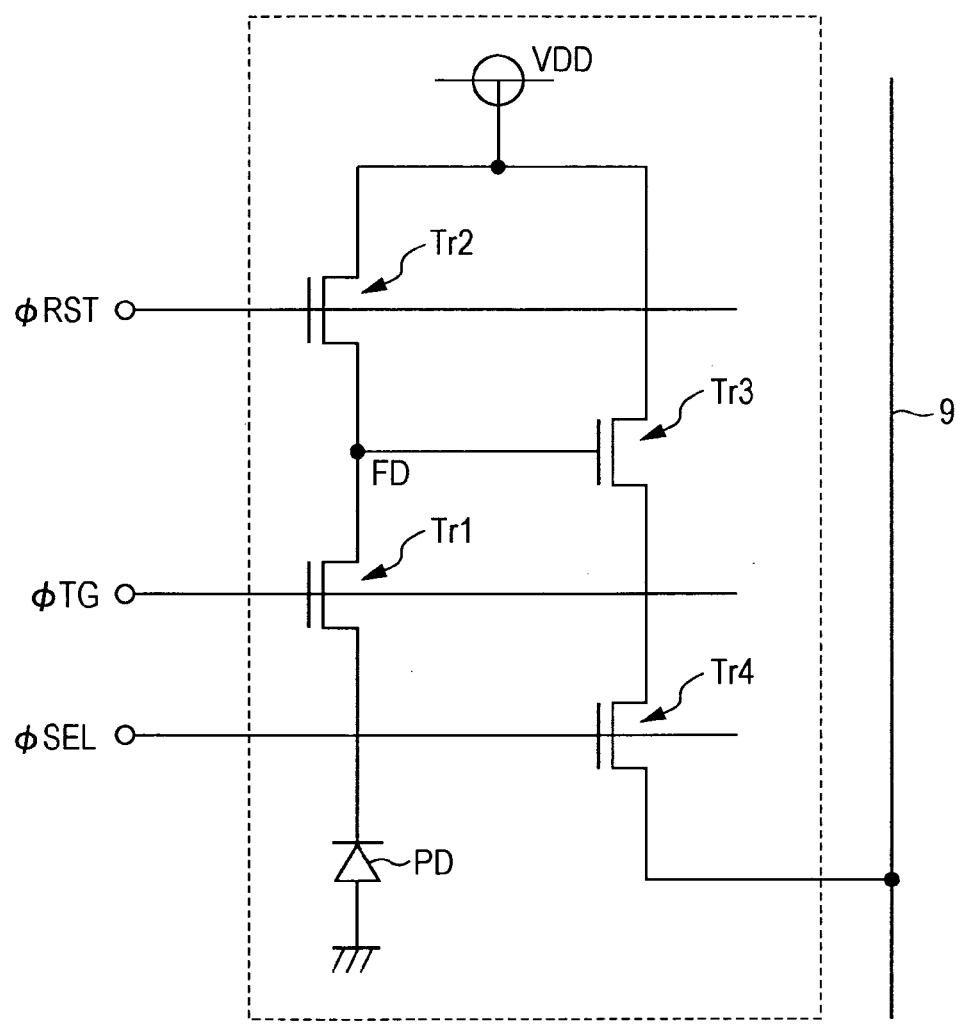
FIG. 2 is an equivalent circuit diagram showing an example of a unit pixel.

FIG. 2 is an equivalent circuit diagram of a unit pixel 21. The unit pixel 21 according to this example is constituted by a photodiode PD serving as a photoelectric conversion unit and four pixel transistors. The four pixel transistors are a transfer transistor Tr1, a reset transistor Tr2, an amplification transistor Tr3, and a selection transistor Tr4. Here, as these pixel transistors Tr1 to Tr4, for example, n-channel MOS transistors are used.

The photodiode PD is connected to the transfer transistor Tr1. The transfer transistor Tr1 is connected to the reset transistor Tr2 through the floating diffusion unit FD. The signal charge (here, electrons) that is photoelectrically converted by the photodiode PD and stored therein is transferred to a floating diffusion unit FD as a result of a transfer pulse $\phi$TRG being given to the gate of the transfer transistor Tr1.

The floating diffusion unit FD is connected to the gate of the amplification transistor Tr3. A power supply VDD is connected to the drain of the amplification transistor Tr3 and the drain of the reset transistor Tr2. Here, the source (the drain of the transfer transistor Tr1) of the reset transistor Tr2 is formed as the floating diffusion unit FD. Prior to the signal charge being transferred from the photodiode PD to the floating diffusion unit FD, as a result of a reset pulse $\phi$RST being given to the reset gate, the electrical potential of the floating diffusion unit FD is reset.

The source of the amplification transistor Tr3 is connected to the drain of the selection transistor Tr4, and the source of the selection transistor is connected to the vertical signal line 9. As a result of a selection pulse $\phi$SEL being given to the gate of the selection transistor Tr4, an on state is reached and the pixel 2 is selected. The amplification transistor Tr3 outputs the electrical potential of the floating diffusion unit FD after the electrical potential is reset by the reset transistor Tr2 by using the electrical potential as a reset level to the vertical signal line 9 through the selection transistor Tr4. Furthermore, the amplification transistor Tr3 outputs the electrical potential of the floating diffusion unit FD after signal charge is transferred by the transfer transistor Tr1 by using the electrical potential as a signal level to the vertical signal line 9 through the selection transistor Tr4. The selection transistor 115 may also be configured to be connected between the power supply VDD and the drain of the amplification transistor Tr3. At this time, the source of the amplification transistor Tr3 is connected to the vertical signal line 9.

In the CMOS solid-state imaging apparatus of a top surface irradiation type, although not shown in the figures, a first-conductivity-type (for example, p-type) semiconductor well area corresponding to the pixel area of the semiconductor substrate is formed with a photodiode PD serving as a photoelectric conversion unit, and a plurality of pixels that includes a plurality of pixel transistors. Pixels are divided by an element isolation area. Over the surface side of the semiconductor substrate, except for over the photodiode PD, a multilayer wiring layer having wiring of a plurality of layer with an interlayer insulating film in between is formed, and a color filter and an on-chip lens are laminated on the multilayer wiring layer with a planarization film in between. Light is irradiated from the surface side of the semiconductor substrate through the on-chip lens to the photodiode.

In the CMOS solid-state imaging apparatus of a back surface irradiation type, although not shown in the figure, a semiconductor substrate formed as a thin film, that is, a semiconductor substrate formed in the p-type semiconductor well area that is a first conductivity type, is formed with a photodiode PD serving as a photoelectric conversion unit and a plurality of pixels that includes a plurality of pixel transistors. Individual pixels are divided by an element isolation area. Over the surface side of the semiconductor substrate, a multilayer wiring layer having wiring of a plurality of layers with an interlayer insulating film in between is formed, and, for example, a backup substrate using a semiconductor substrate is bonded thereto. There is no limitation on the arrangement for the wiring, and the wiring is also formed on the photodiode PD. On the back surface side of the semiconductor substrate, a color filter and an on-chip lens are laminated. Light is irradiated from the back surface side of the semiconductor substrate to the photodiode through the on-chip lens.

2. First Embodiment

Example of Configuration of Solid-State Imaging Apparatus

Figure 3:
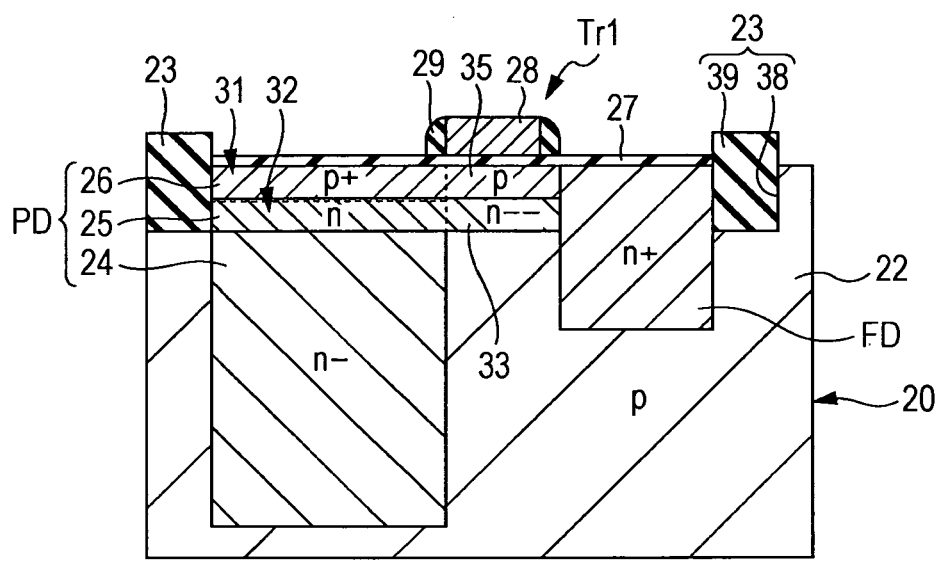
FIG. 3 is a schematic diagram showing a solid-state imaging apparatus according to a first embodiment of the present invention.

FIG. 3 shows a solid-state imaging apparatus according to an embodiment of the present invention, that is, a first embodiment of a CMOS solid-state imaging apparatus. FIG. 3 shows an overall configuration of the main portion of a CMOS solid-state imaging apparatus having a horizontal overflow structure that can be used irrespective of a top surface irradiation type and a back surface irradiation type, the main portion including a photodiode PD and a transfer transistor.

The solid-state imaging apparatus 21 according to the first embodiment includes a first-conductivity-type (for example, p-type) semiconductor well area 22 forming the semiconductor substrate. A photodiode PD is formed in each of the pixel formation areas that are divided by the element isolation area 23 of the p-type semiconductor well area 22. Furthermore, a floating diffusion unit FD using a second-conductivity-type (for example, n-type) semiconductor area, is formed in such a manner as to be adjacent to the photodiode PD. The photodiode PD is constituted by an n-type semiconductor area 24, a charge storage area 25 using an n-type semiconductor area formed thereon in contact with the n-type semiconductor area 24, and a p-type semiconductor area 26 formed on the topmost surface of the semiconductor substrate in contact with the charge storage area 25. The n-type semiconductor area 24 is formed by a comparatively low impurity concentration n-area. The n-type semiconductor area 24 is formed by a high impurity concentration n− area. The p-type semiconductor area 26 becomes an area for surface pinning, and is formed by a comparatively high impurity concentration p+ area. A transfer gate electrode 28 is formed with a gate insulating film 27 in between on the substrate between the photodiode PD and the floating diffusion unit FD, and the transfer transistor Tr1 is formed therein. A side wall 29 is formed on the side surface of the transfer gate electrode 228.

In the present embodiment, a p-type ion implantation area 31 is formed by ion-implanting a p-type impurity over the entirety of the surface of the photodiode PD and the surface of the semiconductor substrate below the transfer gate electrode 28. This p-type ion implantation area 31 is formed as a p-type semiconductor area for surface pinning. Furthermore, by ion-implanting an n-type impurity below the entire area of the p-type ion implantation area 31, an n-type ion implantation area 32 is formed. This n-type ion implantation area 32 is formed as an n-type semiconductor area forming an overflow path below the transfer gate electrode 28 together with the charge storage area 25 of the photodiode PD.

As will be described later, the p-type ion implantation and the n-type ion implantation are performed after the low concentration n-type semiconductor area 24 is formed and before the charge storage area 25 and the p-type semiconductor area 26 are formed. The n-type ion implantation area is formed in such a manner as to be superposed on the surface side of the low concentration n-type semiconductor area 24 of the photodiode PD. As a result, the n-type charge storage area 25 at a concentration higher than that of the low concentration n-type semiconductor area 24 is formed on the surface side of the photodiode PD. Furthermore, in a portion corresponding to below the transfer gate electrode 28 of the n-type ion implantation area 32, an n-type semiconductor area (n−− area) 33 at a concentration lower than that of, for example, the low concentration n-type semiconductor area 24 of the photodiode PD serving as an overflow path.

On the other hand, the p-type ion implantation area 31 is formed at a uniform concentration from the photodiode PD to below the transfer gate electrode 28 on the surface of the p-type semiconductor well area 22, and in an area corresponding to below the transfer gate electrode 28, a p-type semiconductor area (p-type area) 35 for surface pinning is formed. On the side of the photodiode PD, by selectively ion-implanting a p-type impurity again to the p-type ion implantation area 31, a p-type semiconductor area 26 for surface pinning at a concentration higher than that of the p-type semiconductor area 35 for surface pinning below the transfer gate electrode 28 is formed.

The solid-state imaging apparatus 21 of the first embodiment is configured to have a horizontal overflow structure in which, in the manner described above, the floating diffusion unit FD is used as an overflow drain, and an area 33 using the n-type ion implantation area 32 below the transfer gate electrode 28 is used as an overflow path.

Description of Operation

In the solid-state imaging apparatus 21 according to the first embodiment, an overflow path using the n-type semiconductor area 33 is formed in such a manner as to be connected to the floating diffusion unit FD from the photodiode PD below the transfer gate electrode 28. During the storage of the electric charge, the irradiated light is photoelectrically converted inside the photodiode PD, and the generated signal charge is stored in the charge storage area 25. In the photodiode PD, the maximum amount of electric charge that can be stored is determined in advance. If light stronger than that is irradiated, the electric charge overflows from the photodiode PD. The electric charge overflowing from the photodiode PD passes through the n-type semiconductor area 33 that is used as an overflow path below the transfer gate electrode 28, flows to the floating diffusion unit FD, and is discharged.

More specifically, as the electric charge is stored in the photodiode PD, the potential of the photodiode PD is subjected to modulation. The electrical potential of the photodiode PD is determined in accordance with the amount of electric charge stored in the photodiode PD. When the electrical potential in the photodiode PD approaches the overflow barrier level forming the overflow path below the transfer gate electrode 28, the electric charge overflows to the floating diffusion unit FD due to thermal excitation from the photodiode PD. This is an operation when the electric charge of the photodiode PD overflows to the floating diffusion unit FD.

According to the solid-state imaging apparatus 21 in accordance with the first embodiment, an n-type ion implantation area 32 is formed by ion-implanting an n-type impurity of a uniform dosage over the entire area from the photodiode PD to the floating diffusion unit FD through the transfer gate electrode 28. As described above, since the n-type ion implantation area 32 is uniformly distributed on the surface of the photodiode PD and over the entire area below the transfer gate electrode 28, the influence of mask misalignment is reduced. As a result, it is possible to stably form a horizontal overflow path using the n-type semiconductor area 33 below the transfer gate electrode 28. That is, it is possible to form an overflow path without being influenced by manufacturing variations. Therefore, variations in the overflow barrier due to mask misalignment are eliminated, and pixel characteristics can be improved.

The n-type charge storage area 25 of the photodiode PD is formed in a portion in which the surface side of the low concentration n-type semiconductor area 24 that is formed by being regulated by a mask superposes the n-type ion implantation area 32. The impurity concentration of the charge storage area 25 becomes the total of the impurity concentration of the n-type semiconductor area 24 and the impurity concentration of the n-type ion implantation area 32. It is possible to relatively decrease the dosage of the n-type impurity when the low concentration n-type semiconductor area 24 is to be formed with a mask in between, and it is possible to relatively reduce the influence of mask misalignment.

The solid-state imaging apparatus 21 having a horizontal overflow structure according to the first embodiment can be applied to a CMOS solid-state imaging apparatus of a back surface irradiation type or a CMOS solid-state imaging apparatus of a top surface irradiation type in a case where a p-type semiconductor substrate is used for a semiconductor substrate.

Example of Method of Manufacturing Solid-State Imaging Apparatus

Figure 4A:
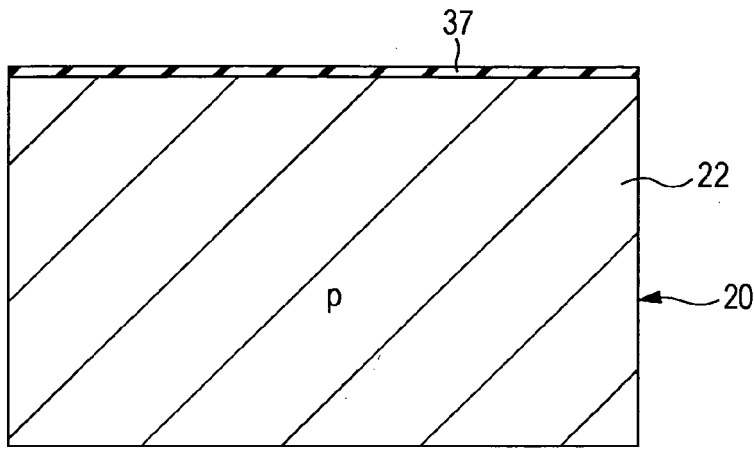
FIGS. 4A, 4B, and 4C are manufacturing process charts (No. 1) showing a method of manufacturing a solid-state imaging apparatus according to the first embodiment of the present invention.

Next, with reference to FIGS. 4A, 4B, and 4C, FIGS. 5D, 5E, and 5F, and FIGS. 6G and 6H, a description will be given of a method of manufacturing the solid-state imaging apparatus 21 according to the first embodiment. First, as shown in FIG. 4A, an insulating film 37 is formed by thermal oxidation on the top surface of the silicon semiconductor substrate 20. Next, a p-type semiconductor well area 22 is formed on the silicon semiconductor substrate 20. The p-type semiconductor well area 22 is formed in such a manner that, for example, a mask, such as a resist mask, is formed on an area other than the p-type semiconductor well area in which the silicon semiconductor substrate 20 is to be formed, and a p-type impurity is ion-implanted.

Figure 4B:
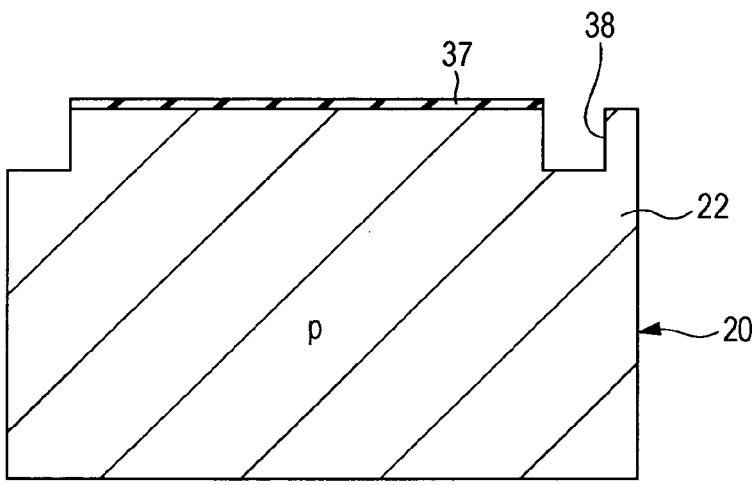

Next, as shown in FIG. 4B, a hardmask layer (not shown) is formed on the insulating film 37, and the hardmask layer is patterned by a lithography technique and an etching technique so as to form a hardmask. Furthermore, by using this hardmask as an etching mask, a trench (groove) 38 to be element-separated, including pixel isolation, is formed by dry etching.

Figure 4C:
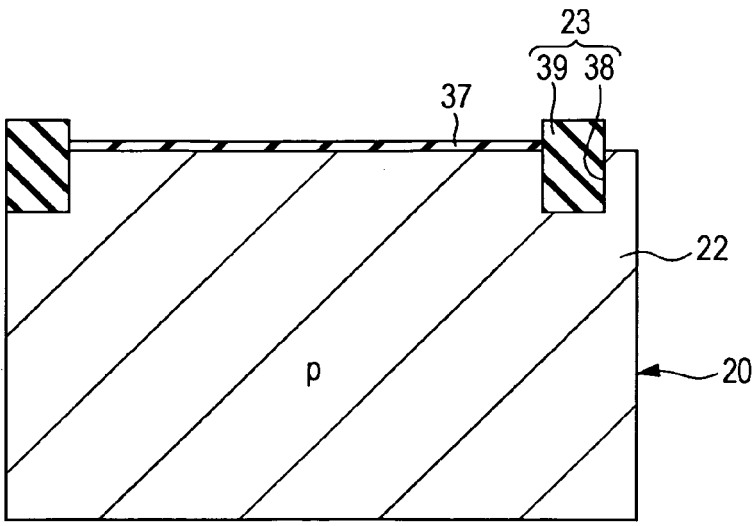

Next, as shown in FIG. 4C, an insulating film 39 is buried within the trench 38 by a chemical vapor growth (CVD) method, and an element isolation area 23 of a shallow trench isolation (STI) structure is formed.

Figure 5D:
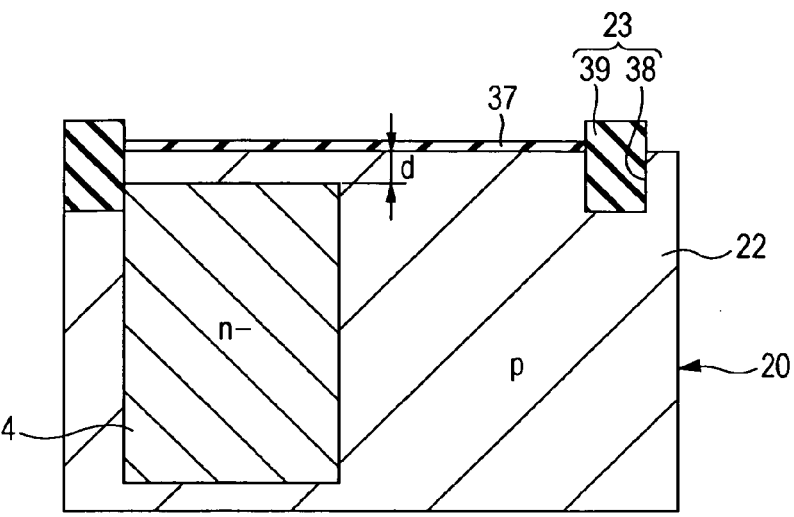
FIGS. 5D, 5E, and 5F are manufacturing process charts (No. 2) showing the method of manufacturing a solid-state imaging apparatus according to the first embodiment of the present invention.

Next, as shown in FIG. 5D, a low impurity concentration n-type semiconductor area (n-area) 24 forming a photodiode is formed in the p-type semiconductor well area 22 of individual pixel formation areas that are divided by the element isolation area 23. This n-type semiconductor area 24 is formed in such a manner that, for example, a mask, such as a resist film, is formed in the p-type semiconductor well area 22 except for the photodiode formation area, and an n-type impurity is ion-implanted. The n-type semiconductor area 24 is formed in the p-type semiconductor well area 22 while leaving a necessary depth from the surface of the p-type semiconductor well area 22, for example, while leaving a depth d=0.1 μm of the p-type semiconductor area for surface pinning.

Figure 5E:
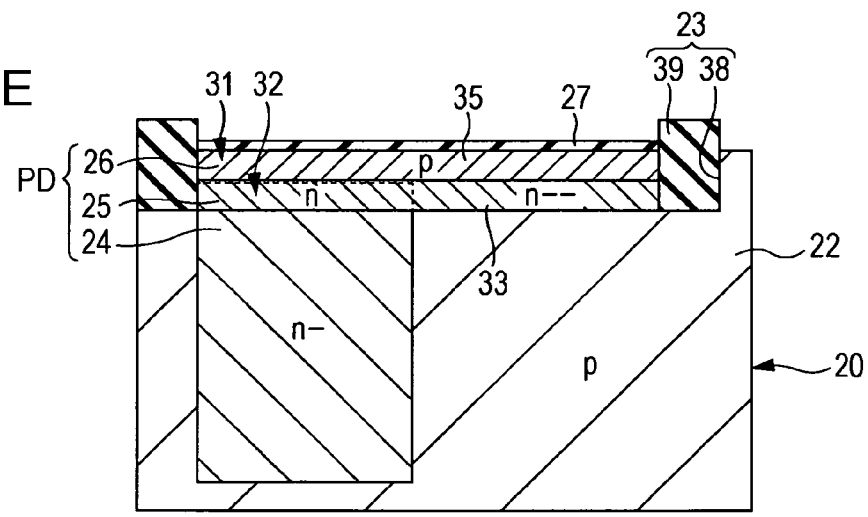

Next, as shown in FIG. 5E, ion implantation of p-type and n-type impurities is performed with a mask, such as a resist mask, in between on the surface of the p-type semiconductor area 22 over the entire area corresponding to the photodiode, the transfer gate electrode, and the floating diffusion unit, which are to be formed. Next, by using the same mask, an n-type impurity is ion-implanted, and an n-type ion implantation area 32 is formed below the entire area of the p-type ion implantation area 31.

The ion implantation depth of the p-type impurity, which constitutes the p-type ion implantation area 31, is in the neighborhood of 0.1 μm from the topmost surface of the substrate, which is a width at which a depth sufficient to pin the substrate surface can be secured. Preferably, the dosage of the ion implantation is $1 \times 10^{11}$ to $5 \times 10^{12}$ cm$^{-2}$. If the dosage is lower than $1 \times 10^{11}$ cm$^{-2}$, it is not possible to sufficiently pin the substrate surface, and if the dosage is higher than $5 \times 10^{12}$ cm$^{-2}$, a complete transfer becomes difficult. The ion implantation depth of the n-type impurity that constitutes the n-type ion implantation area 32 is in the neighborhood of 0.1 to 0.3 μm, and preferably, the dosage of the ion implantation is $1 \times 10^{11}$ to $5 \times 10^{12}$ cm$^{-2}$. It is necessary to form the n-type ion implantation area 32 in an area deeper than the p-type ion implantation area 31, but if the dosage is deeper than 0.3 μm, a complete transfer becomes difficult.

A p-type semiconductor area for surface pinning is formed by using the p-type ion implantation area 31. The ion implantation of the n-type impurity is performed so as to superpose the surface portion of the low concentration n-type semiconductor area 24. An n-type semiconductor area (n-area) 33 serving as an overflow path is formed in a portion corresponding to below the transfer gate electrode 28 of the n-type ion implantation area 32. At the same time, a charge storage area 25 using a high concentration n-type semiconductor area is formed on the surface portion in which the n-type ion implantation area 33 and the low concentration n-type semiconductor area 24 superpose each other.

Next, a p-type impurity is ion-implanted once more in the p-type ion implantation area 31 on the n-type charge storage area 25 with a mask, such as a selectively formed resist mask, in, between so as to form a high concentration p-type semiconductor area (p+ area) 26. The p-type semiconductor area 26 becomes a p-type semiconductor area for surface pinning on the side of the photodiode. On the other hand, a portion below the transfer gate electrode 28 of the p-type ion implantation area 31 becomes a p-type semiconductor area for surface pinning below the transfer gate electrode 28. A photodiode PD is formed by using the low concentration n-type semiconductor area 24, the n-type charge storage area 25, and the p-type semiconductor area 26 for surface pinning.

Figure 5F:
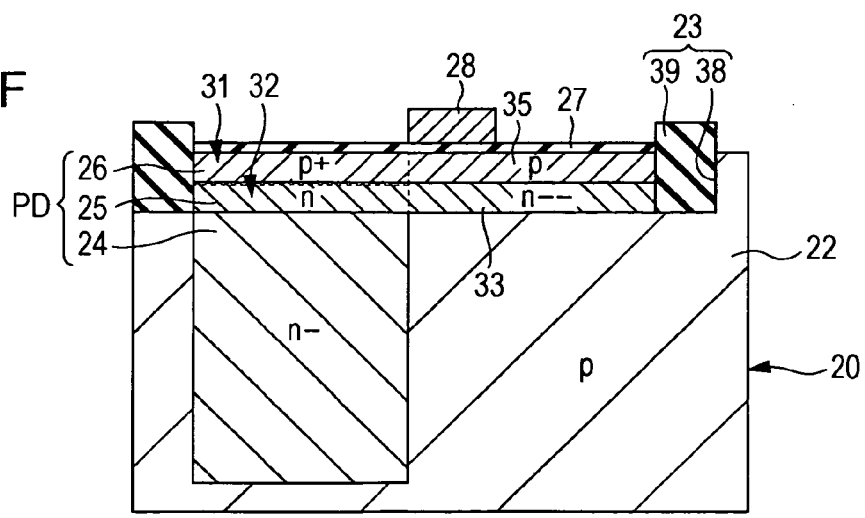

The gate electrode of the pixel transistor is formed on the gate insulating film 27. FIG. 5F shows only the transfer gate electrode 28. The gate electrode 28 can be formed by using doped polysilicon or a metal, such as copper or aluminum. By dry-etching a conductive film selected from these by a lithography technique and an etching technique, the transfer gate electrode 28 is formed.

Figure 6G:
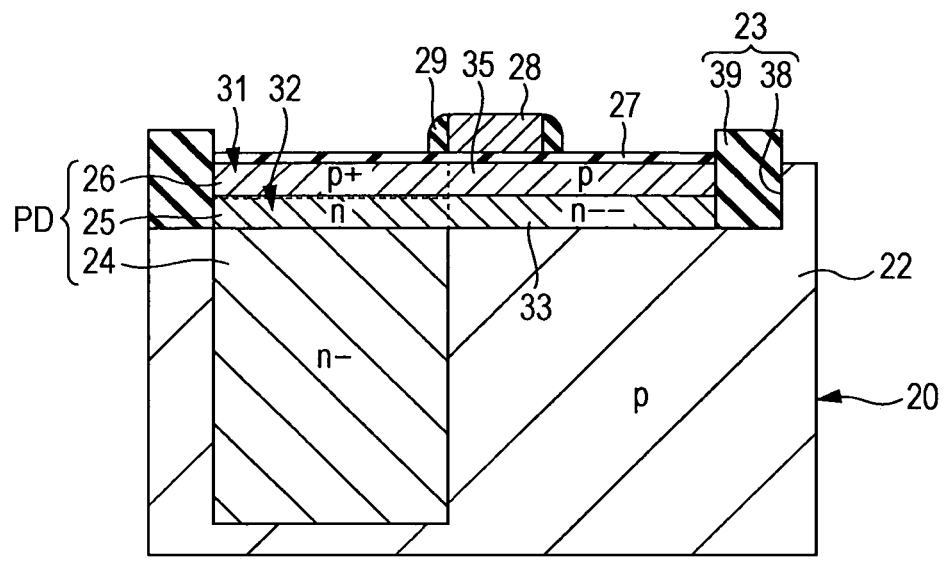
FIGS. 6G and 6H are manufacturing process charts (No. 3) showing the method of manufacturing a solid-state imaging apparatus according to the first embodiment of the present invention.

Next, as shown in FIG. 6G, a side wall 29 is formed on the side surface of each gate electrode, that is, the transfer gate electrode 28 in the figure. That is, after a resist mask is removed in the previous step, by using the chemical vapor growth (CVD) method and a dry etching method, a side wall 29 using oxide silicon, in which a silicon nitride film is used as a stopper film, is formed on the side surface of the transfer gate electrode 28.

Figure 6H:
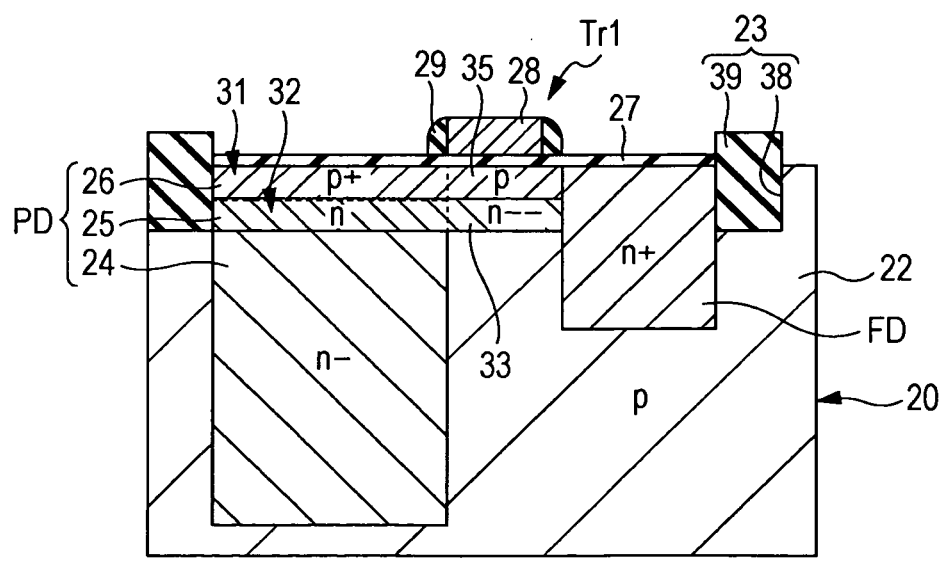

Next, as shown in FIG. 6H, by using the resist mask, the transfer gate electrode 28, and the side wall 29 formed on the photodiode PD as masks, an n-type impurity is ion-implanted so as to form a floating diffusion unit FD using an n-type semiconductor area. An element isolation area 23 of an STI structure is also used as a mask. At the same time, the n-type source area and the n-type drain area of another pixel transistor are formed. At this point, a plurality of pixel transistors including the transfer transistor Tr1 is formed.

In the steps after that, in the case of the CMOS solid-state imaging apparatus of a top surface irradiation type, a multilayer wiring layer having wiring of a plurality of layers with an interlayer insulating film in between is formed over the surface of the semiconductor substrate. Furthermore, a color filter and an on-chip lens are sequentially formed with a planarization film in between. In the case of a back surface irradiation type solid-state imaging apparatus, a multilayer wiring layer having wiring of a plurality of layers formed with an interlayer insulating film in between is formed over the surface of the semiconductor substrate, and a backup substrate formed using a silicon substrate is bonded on the multilayer wiring layer with a planarization film in between. Next, a thinner film is formed from the back surface of the semiconductor substrate by, for example, a chemical mechanical polishing (CMP) method. Next, a color filter and an on-chip lens are formed on the back surface of the semiconductor substrate with an anti-reflective film in between. In the manner described above, an intended solid-state imaging apparatus 21 is obtained.

According to the method of manufacturing the solid-state imaging apparatus in accordance with the first embodiment, the low concentration n-type semiconductor area 24 of the photodiode PD is formed, and thereafter, a p-type ion implantation area 31 and an n-type ion implantation area 32 are formed. These ion implantation areas 31 and 32 are formed by uniform impurity ion implantation over the entire surface of the n-type semiconductor area 24 of the photodiode PD, below the transfer gate electrode to be formed, and the floating diffusion unit. As a result, the p-type semiconductor area for surface pinning and the n-type semiconductor area serving as an overflow path can be accurately formed without being influenced by mask misalignment. Variations of the overflow barrier that forms an overflow path below the transfer gate electrode are reduced.

Since the n-type charge storage area 25 is formed in an area in which the surface side of the low concentration n-type semiconductor area 24 of the photodiode PD superposes the n-type ion implantation area 32, it is possible to relatively decrease the impurity dosage of the low concentration n-type semiconductor area 24. Consequently, it is possible to relatively reduce the influence of mask misalignment. As a result, it is possible to manufacture, with high accuracy, a CMOS solid-state imaging apparatus of a horizontal overflow structure in which variations of an overflow barrier are suppressed and pixel characteristics are improved.

3. Second Embodiment

Example of Configuration of Solid-State Imaging Apparatus

Figure 7:
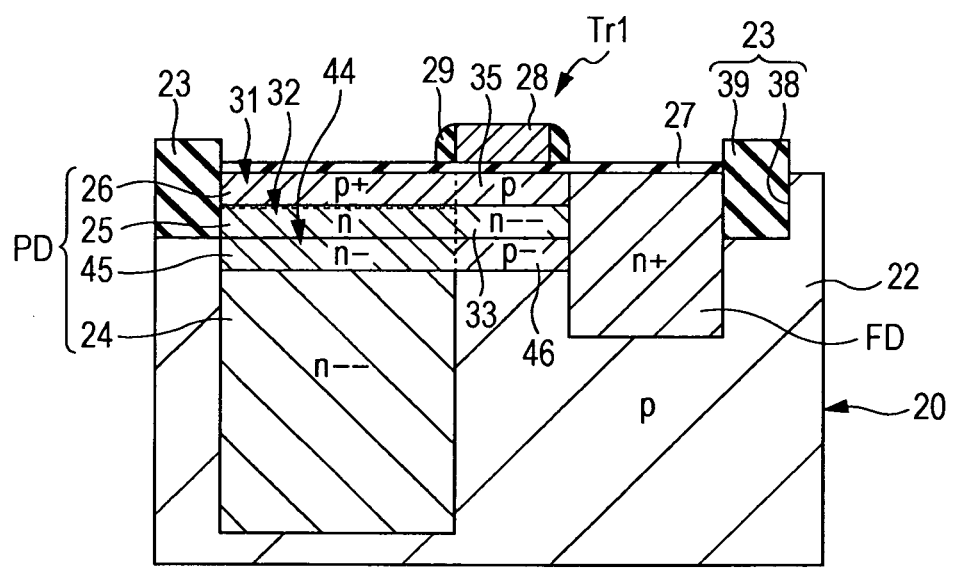
FIG. 7 is a schematic diagram showing a solid-state imaging apparatus according to a second embodiment of the present invention.

FIG. 7 shows a solid-state imaging apparatus according to a second embodiment of the present invention, that is, a CMOS solid-state imaging apparatus. FIG. 7 shows a top CMOS solid-state imaging apparatus having a horizontal overflow structure, which can be applied irrespective of a surface irradiation type and a back surface irradiation type, and also shows an overall configuration of the main portion including a photodiode PD and a transfer transistor.

A solid-state imaging apparatus 43 according to the second embodiment is configured to include a first-conductivity-type ion implantation area 44 for stably forming an overflow path below the second-conductivity-type ion implantation area 32 serving as the overflow path of the first embodiment.

Similarly to the first embodiment, in the solid-state imaging apparatus 43 according to the second embodiment, a photodiode PD is formed in a pixel formation area having the first-conductivity-type (for example, p-type) semiconductor well area 22, which constitutes the semiconductor substrate, and which is divided by the element isolation area 23 of the p-type semiconductor well area 22. A floating diffusion unit FD using a second-conductivity-type (for example, n-type) semiconductor area is formed so as to be adjacent to the photodiode PD. The photodiode PD is constituted by the n-type semiconductor area 24, the charge storage area 25 using an n-type semiconductor area formed in contact with the n-type semiconductor area 24, and the p-type semiconductor area 26 formed on the topmost surface of the semiconductor substrate in contact with the charge storage area 25. The n-type semiconductor area 24 is formed using an n−− area having a comparatively low impurity concentration. The charge storage area 25 is formed using an n−− area at an impurity concentration higher than that of the n-type semiconductor area 24. The p-type semiconductor area 26 serves as an area for surface pinning, and is formed using a p+ area having a comparatively high impurity concentration. The transfer gate electrode 28 is formed with the gate insulating film 27 in between on the substrate between the photodiode PD and the floating diffusion unit FD, and the transfer transistor Tr1 is formed. The side wall 29 is formed on the side surface of the transfer gate electrode 228.

In the present embodiment, by ion-implanting a p-type impurity over the entirety of the surface of the photodiode PD and the surface of the semiconductor substrate below the transfer gate electrode 28, a p-type ion implantation area 31 is formed. The p-type ion implantation area 31 is formed as a p-type semiconductor area for surface pinning. Furthermore, by ion-implanting an n-type impurity below the entire area of the p-type ion implantation area 31, an n-type ion implantation area 32 is formed. The n-type ion implantation area 32 is formed as an n-type semiconductor area that forms the charge storage area 25 of the photodiode PD and an overflow path below the transfer gate electrode 28.

The n-type ion implantation area is formed so as to be superposed on the surface side of the low concentration n-type semiconductor area 24 of the photodiode PD, and an n-type charge storage area 25 at a concentration higher than that of the low concentration n-type semiconductor area 24 is formed on the surface side of the low concentration n-type semiconductor area 24 of the photodiode PD. In a portion corresponding to below the transfer gate electrode 28 of the n-type ion implantation area 32, an n-type semiconductor area 24 serving as an overflow path at a concentration, for example, at a concentration lower than the low concentration n-type semiconductor area (n−− area) 33 of the photodiode PD, is formed.

On the other hand, the p-type ion implantation area 31 is formed at a uniform concentration from the photodiode PD to below the transfer gate electrode 28 on the surface of the p-type semiconductor well area 22, and a p-type semiconductor area (p-type area) 35 for surface pinning is formed in an area corresponding to below the transfer gate electrode 28. On the side of the photodiode PD, by selectively ion-implanting a p-type impurity again into the p-type ion implantation area 31, a p-type semiconductor area 26 for surface pinning at a concentration higher than that of the p-type semiconductor area 35 for surface pinning below the transfer gate electrode 28 is formed.

Furthermore, in the present embodiment, a first-conductivity-type (that is, p-type) ion implantation area 44 for stably forming an overflow path is formed below the entire area of the n-type ion implantation area 32 serving as an overflow path. In the n-type ion implantation area 32 serving as a horizontal overflow path, when the impurity concentration distribution in the substrate depth direction is viewed, a tail portion in which the impurity concentration decreases on the deep side of the substrate is formed. The impurity concentration of the tail portion is likely to vary. For this reason, there is a concern that the electric charge that overflows from the photodiode PD to the floating diffusion unit FD varies for each pixel. The p-type ion implantation area 44 below the n-type ion implantation area 32 eliminates a tail portion of the impurity distribution of the n-type ion implantation area 32 so as to stabilize the impurity concentration of the n-type ion implantation area 32.

The p-type ion implantation area 44 allows an n-type area 45, which has a concentration lower than that of the n-type charge storage area 25 and higher than that of the low concentration n-type semiconductor area 24, to be formed below the n-type charge storage area 25 of the photodiode PD. Furthermore, the p-type ion implantation area 44 allows a p-type semiconductor area 46 to be formed below the n-type semiconductor area 33 serving as an overflow path.

In FIG. 7, the impurity concentrations of the low concentration n-type semiconductor area 24 and the n-type charge storage area 25 of the photodiode PD are substantially the same as those of FIG. 3. Regarding the comparison of the concentration of the n-type semiconductor area 45 using the p-type ion implantation area 44 and the concentration of the n-type semiconductor area 24, the n-type semiconductor area 24 is represented as n−−.

In the manner described above, the solid-state imaging apparatus 43 of the second embodiment is configured to include a horizontal overflow structure in which the floating diffusion unit FD is used as an overflow drain, the n-type ion implantation area 32 is used as an overflow path, and a p-type ion implantation area 44 is provided therebelow.

Description of Operation

In the solid-state imaging apparatus 43 according to the second embodiment, similarly to the first embodiment, an overflow path using an n-type semiconductor area 33 is formed below the transfer gate electrode 28 in such a manner as to be connected to the floating diffusion unit FD from the photodiode PD. When electric charge is to be stored, the irradiated light is photoelectrically converted in the photodiode PD, and the generated signal charge is stored in the charge storage area 25. The electric charge that exceeds the maximum amount of electric charge that is generated as a result of strong light being irradiated passes the n-type semiconductor area 33 serving as an overflow path below the transfer gate electrode 28, flows to the floating diffusion unit FD, and is discharged.

As a result of a p-type ion implantation area 44 being formed below the entire area of the n-type ion implantation area 32, the impurity concentration of the n-type ion implantation area 32 is stabilized. As a result, the n-type ion implantation area 32 below the transfer gate electrode 28, that is, the overflow barrier of the n-type semiconductor area 33 serving as an overflow path, is stabilized without being varied for each pixel.

According to the solid-state imaging apparatus 43 in accordance with the second embodiment, similarly to the first embodiment, the n-type semiconductor area 33 serving as an overflow path is formed in the n-type ion implantation area 32 over the entire area from the photodiode PD to the floating diffusion unit FD. The n-type ion implantation area 32 is uniformly distributed over the surface of the photodiode PD and over the entire area below the transfer gate electrode 28. Consequently, the influence of mask misalignment is reduced, and a horizontal overflow path using the n-type semiconductor area 33 can be stably formed below the transfer gate electrode 28. The overflow path can be formed without being influenced by manufacturing variations, and variations in the overflow barrier due to mask misalignment are eliminated, thereby making it possible to improve pixel characteristics. The p-type ion implantation area 31 for surface pinning is uniformly formed over the entire area from the topmost surface of the photodiode PD to below the transfer gate electrode 28. Consequently, the influence of mask misalignment is reduced, and deterioration in the characteristics of pixels can be reduced. The impurity concentration of the charge storage area 25 becomes the total of the impurity concentration of the n-type semiconductor area 24 and the impurity concentration of the n-type ion implantation area 32. Therefore, the dosage of the n-type impurity when the low concentration n-type semiconductor area 24 is to be formed with a mask in between can be relatively reduced, and the influence of mask misalignment can be relatively reduced.

Furthermore, according to the second embodiment, since the p-type ion implantation area 44 is provided below the n-type ion implantation area 32, the overflow barrier level at which the overflow path is formed is stabilized. As a result, the amount of saturated charge of the photodiode PD does not vary for each pixel, and variations in the pixel characteristics can be reduced.

The solid-state imaging apparatus 43 having a horizontal overflow structure according to the second embodiment can be applied to a back surface irradiation type CMOS solid-state imaging apparatus or a top surface irradiation type CMOS solid-state imaging apparatus in a case where a p-type semiconductor substrate is used for a semiconductor substrate.

Example of Method of Manufacturing Solid-State Imaging Apparatus

Figure 8A:
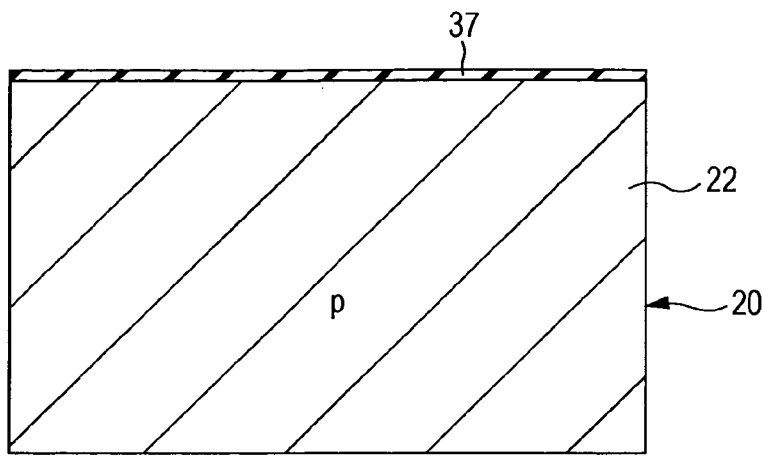
FIGS. 8A, 8B, and 8C are manufacturing process charts (No. 1) showing the method of manufacturing a solid-state imaging apparatus according to the second embodiment of the present invention.

Next, with reference to FIGS. 8A, 8B, and 8C, FIGS. 9D, 9E, and 9F, and FIGS. 10G and 10H, a description will be given of a method of manufacturing the solid-state imaging apparatus 43 according to the second embodiment. First, as shown in FIG. 8A, an insulating film 37 is formed by thermal oxidation on the top surface of the silicon semiconductor substrate 20. Next, the p-type semiconductor well area 22 is formed on the silicon semiconductor substrate 20. The p-type semiconductor well area 22 is formed in such a manner that, for example, a mask, such as a resist mask, is formed in an area other than the p-type semiconductor well area to be formed of the silicon semiconductor substrate 20, and a p-type impurity is ion-implanted.

Figure 8B:
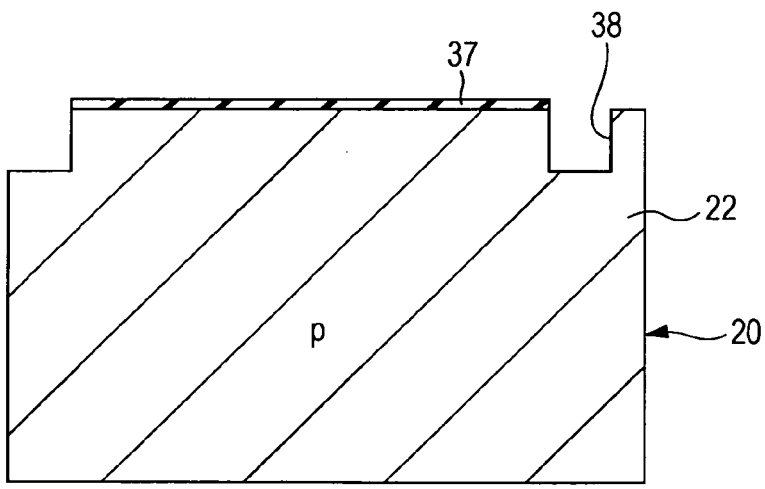

Next, as shown in FIG. 8B, a hardmask layer (not shown) is formed on the insulating film 37, and the hardmask layer is patterned by a lithography technique and an etching technique, thereby forming a hardmask. Furthermore, by using this hardmask as an etching mask, the trench (groove) 38 is formed in an area to be element-separated, including pixel isolation, by dry etching.

Figure 8C:
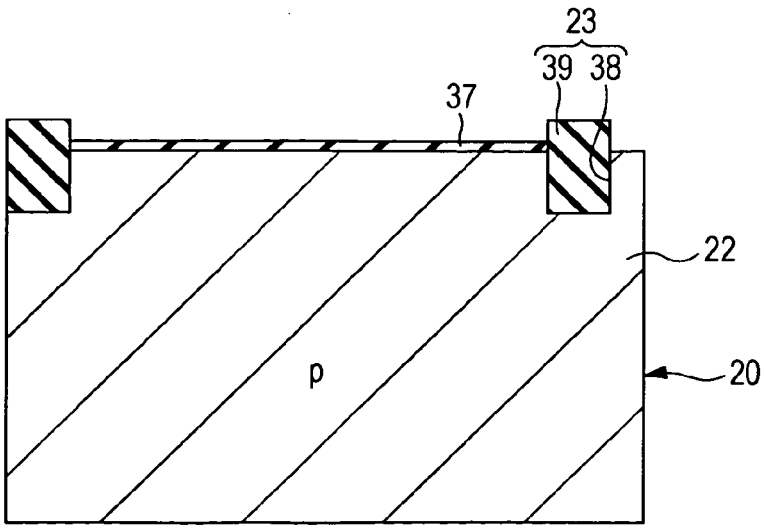

Next, as shown in FIG. 8C, the insulating film 39 is buried in the trench 38 by a chemical vapor growth (CVD) method, and the element isolation area 23 of an STI structure is formed.

Figure 9D:
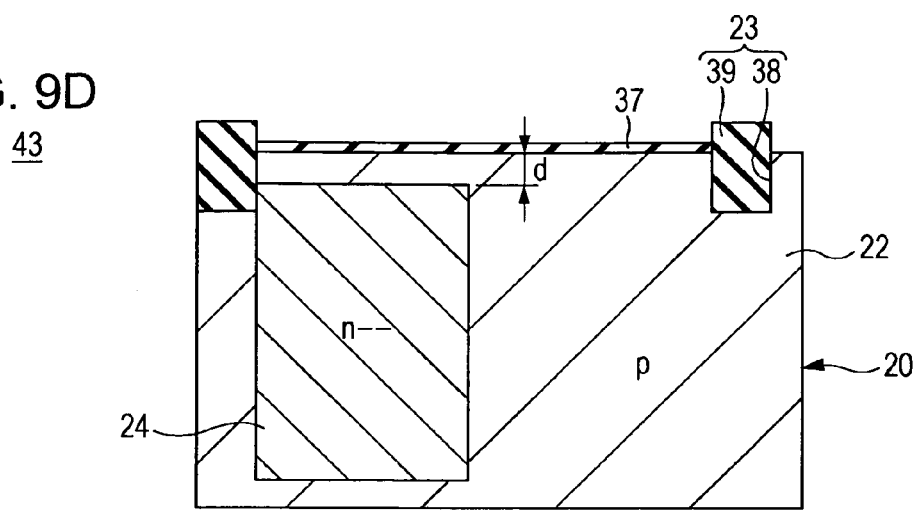
FIGS. 9D, 9E, and 9F are manufacturing process charts (No. 2) showing the method of manufacturing a solid-state imaging apparatus according to the second embodiment of the present invention.

Next, as shown in FIG. 9D, the low impurity concentration n-type semiconductor area (n− area) 24 forming a photodiode is formed in the p-type semiconductor well area 22 of each pixel formation area that is divided by the element isolation area 23. This n-type semiconductor area 24 is formed in such a manner that, for example, a mask, such as a resist film, is formed on the p-type semiconductor well area 22 in an area except for the photodiode formation area, and an n-type impurity is ion-implanted. The n-type semiconductor area 24 is formed in the p-type semiconductor well area 22 while leaving a necessary depth from the surface of the p-type semiconductor well area 22, for example, while leaving the depth d=0.1 μm of the p-type semiconductor area for surface pinning.

Figure 9E:
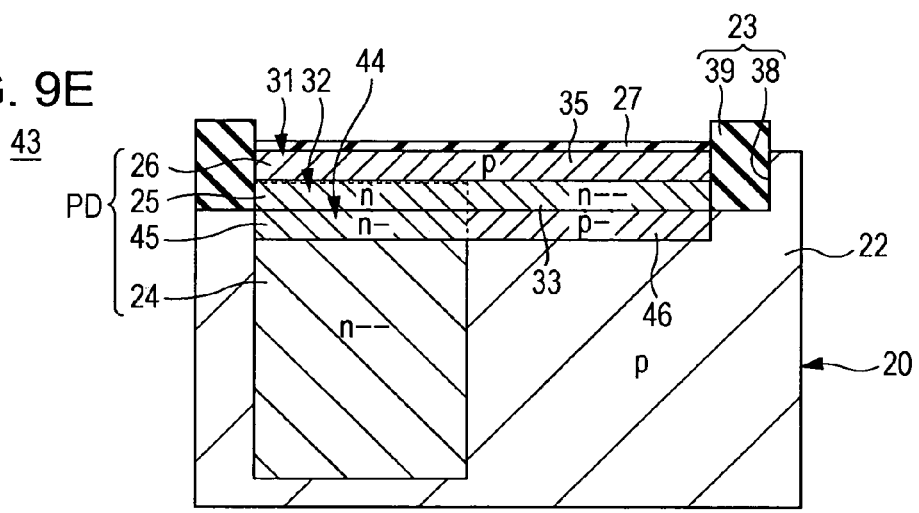

Next, as shown in FIG. 9E, ion implantation of p-type, n-type, and p-type impurities is performed on the surface of the p-type semiconductor area 22 corresponding to a photodiode to be formed, a transfer gate electrode, and a floating diffusion unit with a mask, such as a resist mask, in between.

The ion implantation depth of the p-type impurity, at which the p-type ion implantation area 31 is formed, is in the neighborhood of 0.1 μm from the topmost surface of the substrate, which is the width at which the depth for sufficiently pinning the substrate surface can be secured, and preferably, the dosage of ion implantation is $1\times10^{11}$ to $5\times10^{12}$ cm$^{-2}$. If the dosage is lower than $1\times10^{11}$ cm$^{-2}$, it is difficult to sufficiently pin the substrate surface, and if the dosage is higher than $5\times10^{12}$ cm$^{-2}$, a complete transfer becomes difficult. The ion implantation depth of an n-type impurity, at which the n-type ion implantation area 32 is formed, is in the neighborhood of 0.1 to 0.3 μm, and preferably, the dosage of ion implantation is $1\times10^{11}$ to $5\times10^{12}$ cm$^{-2}$. It is necessary to form the n-type ion implantation area 32 in an area deeper than the p-type ion implantation area 31. However, if the ion implantation depth is deeper than 0.3 μm, a complete transfer becomes difficult. The ion implantation depth of the p-type impurity at which the p-type ion implantation area 44 is formed is in the neighborhood of 0.3 to 0.5 μm, which is deeper than that of the n-type ion implantation area 32 and is not away therefrom, so order to eliminate the tail portion of the n-type ion implantation area 32. Preferably, the dosage of ion implantation is $1\times10^{11}$ to $5\times10^{12}$ cm$^{-2}$. If the dosage is lower than $1\times10^{11}$ cm$^{-2}$, it is not possible to cancel the tail portion of the n-type ion implantation area 32, and if the dosage is higher than $5\times10^{12}$ cm$^{-2}$, there is a risk that the concentration of the n-type semiconductor area 45 becomes a p-type. The semiconductor area in which the overflow barrier is stabilized is made such that the portion corresponding to the photodiode PD is an n-type, and the portion corresponding to below the transfer gate electrode 28 is a p-type.

By using the p-type ion implantation area 31, a p-type semiconductor area for surface pinning is formed. The ion implantation of the n-type impurity is performed so as to superpose the surface portion of the low concentration n-type semiconductor area 24. The n-type semiconductor area (n-- area) 33 serving as an overflow path is formed in a portion corresponding to below the transfer gate electrode 28 of the n-type ion implantation area 32. At the same time, the charge storage area 25 using a high concentration n-type semiconductor area is formed in a surface portion in which the n-type ion implantation area 33 and the low concentration n-type semiconductor area 24 superpose each other.

Next, a p-type impurity is ion-implanted once more in the p-type ion implantation area 31 on the n-type charge storage area 25 with a mask, such as a selectively formed resist mask, in between so as to form a high concentration p-type semiconductor area (p+ area) 26. The p-type semiconductor area 26 becomes a p-type semiconductor area for surface pinning on the side of the photodiode. On the other hand, the portion below the transfer gate electrode 28 of the p-type ion implantation area 31 becomes the p-type semiconductor area 35 for surface pinning below the transfer gate electrode 28. A photodiode PD is formed using the low concentration n-type semiconductor area 24, the n-type charge storage area 25, and the p-type semiconductor area 26 for surface pinning.

Figure 9F:
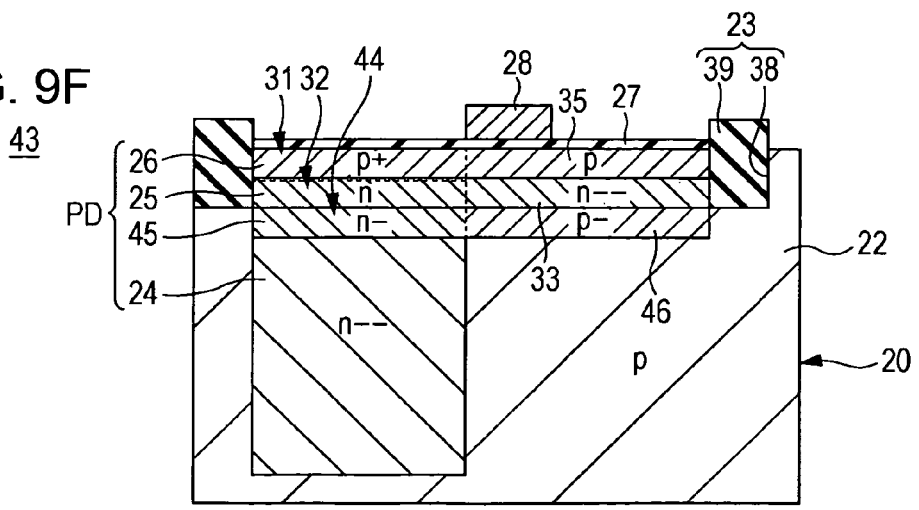

The gate electrode of a pixel transistor is formed on the gate insulating film 27. FIG. 9F shows only the transfer gate electrode 28. The gate electrode 28 can be formed by using doped polysilicon or a metal, such as copper or aluminum. By dry-etching a conductive film selected from these by a lithography technique and an etching technique, the transfer gate electrode 28 is formed.

Figure 10G:
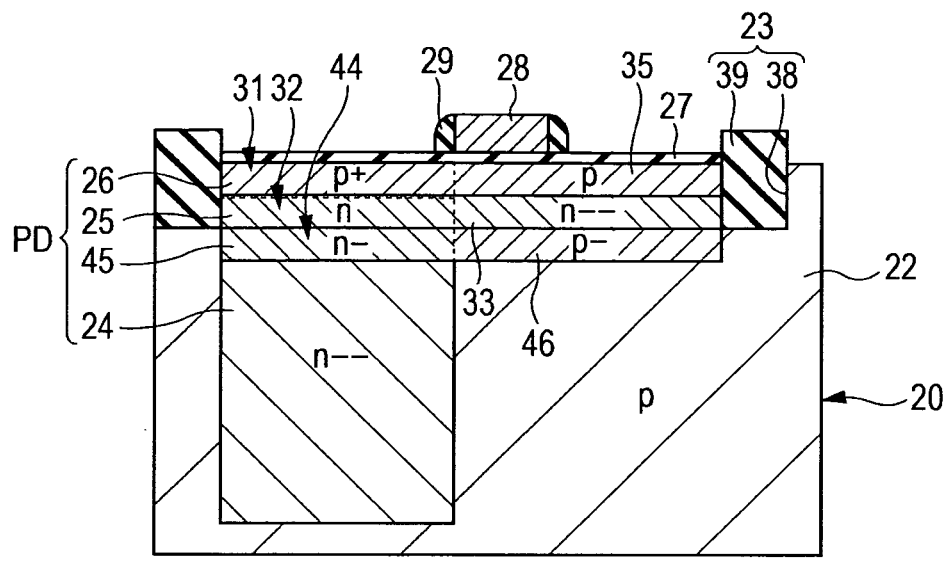
FIGS. 10G and 10H manufacturing process charts (No. 3) showing the method of manufacturing a solid-state imaging apparatus according to the second embodiment of the present invention.

Next, as shown in FIG. 10G, the side wall 29 is formed on the side surface of each gate electrode, that is, the transfer gate electrode 28 in the figure. That is, after the resist mask is removed in the previous step, the side wall 29 using oxide silicon in which a silicon nitride film is used as a stopper film is formed on the side surface of the transfer gate electrode 28 by a chemical vapor growth (CVD) method and a dry etching method.

Figure 10H:
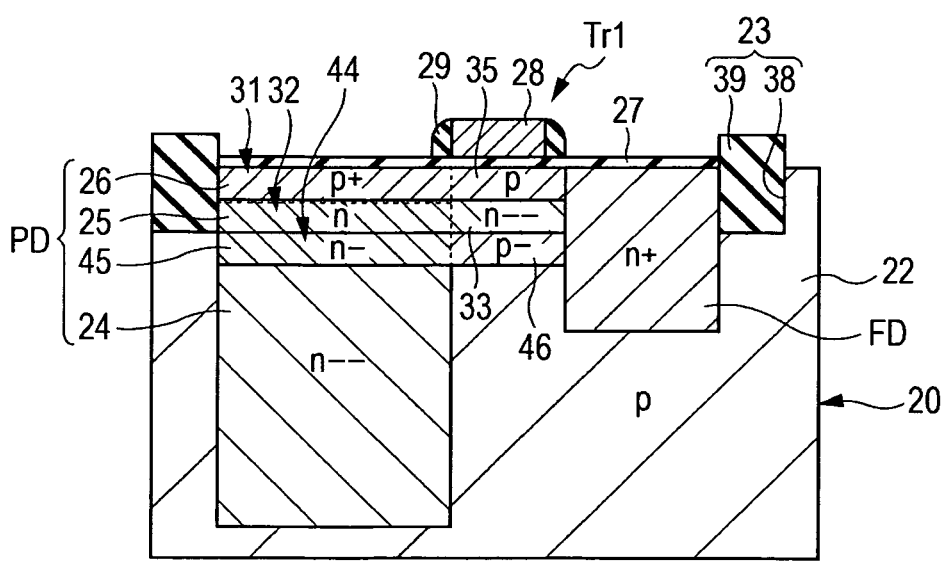

Next, as shown in FIG. 10H, an n-type impurity is ion-implanted by using the resist mask, the transfer gate electrode 28, and the side wall 29 formed on the photodiode PD as masks, and a floating diffusion unit FD using the n-type semiconductor area is formed. The floating diffusion unit FD is formed by self alignment. The element isolation area 23 of an STI structure is also used as a mask. At the same time, an n-type source area and an n-type drain area of another pixel transistor are formed. Thus, a plurality of pixel transistors including the transfer transistor Tr1 are formed.

In the steps after that, in the case of a top surface irradiation type CMOS solid-state imaging apparatus, a multilayer wiring layer having wiring of a plurality of layers formed with an interlayer insulating film in between is formed over the surface of the semiconductor substrate. Furthermore, a color filter and an on-chip lens are sequentially formed with a planarization film in between. In the case of a back surface irradiation type solid-state imaging apparatus, a multilayer wiring layer having wiring of a plurality of layers formed with an interlayer insulating film in between is formed over the surface of the semiconductor substrate, and a backup substrate using a silicon substrate is bonded on the multilayer wiring layer with a planarization film in between. Next, a thinner film is formed by, for example, a chemical mechanical polishing (CMP) method from the back surface side of the semiconductor substrate. Next, a color filter and an on-chip lens are formed with an anti-reflective film in between on the back surface of the semiconductor substrate. In the manner described above, an intended solid-state imaging apparatus 43 is obtained.

According to the method of manufacturing a solid-state imaging apparatus of the second embodiment, after the low concentration n-type semiconductor area 24 of the photodiode PD is formed, the p-type ion implantation area 31, the n-type ion implantation area 32, and the p-type ion implantation area 44 are formed. The ion implantation areas 31, 32, and 44 are formed by uniform ion implantation of impurities over the entire surface of the n-type semiconductor area 24 of the photodiode PD, below the transfer gate electrode, and the floating diffusion unit. As a result, it is possible to accurately form the p-type semiconductor area for surface pinning, the n-type semiconductor area serving as an overflow path, and an area for stably forming an overflow path without being influenced by mask misalignment. The p-type ion implantation area 44 allows an overflow path to be stably formed. Furthermore, the n-type ion implantation area 32 allows variations in the overflow barrier below the transfer gate electrode to be reduced.

The n-type charge storage area 25 is formed in the area in which the surface side of the low concentration n-type semiconductor area 24 of the photodiode PD and the n-type ion implantation area 32 are superposed with each other. Consequently, it is possible to relatively decrease the impurity dosage of the low concentration n-type semiconductor area 24. Thus, the influence of mask misalignment can be relatively reduced. As a result, it is possible to accurately manufacture a CMOS solid-state imaging apparatus of a horizontal overflow structure in which variations in the overflow barrier are suppressed and pixel characteristics are improved.

For pixels of the CMOS solid-state imaging apparatus according to the above-described embodiment, unit pixels (non-shared-type) formed of one photodiode and a plurality of pixel transistors or shared pixels (shared-type) in which a plurality of photodiodes are made to share one pixel transistor unit can be used.

The solid-state imaging apparatus according to the above-described embodiment is configured so that signal charge is used as electrons, the first conductivity type is used as an n-type, and the second conductivity type is used as a p-type. The present invention can also be applied to a solid-state imaging apparatus in which signal charge is used as holes. In this case, conductivity types of each semiconductor substrate, a semiconductor well area, and a semiconductor area are reversed so that the p-type becomes a first conductivity type and the n-type becomes a second conductivity type.

4. Third Embodiment

Example of Configuration of Electronic Apparatus

The above-described solid-state imaging apparatus according to the embodiment of the present invention can be applied to, for example, a digital still camera, a digital video camera, various portable terminal devices, such as mobile phones with camera, and electronic apparatuses, such as printers.

Figure 11:
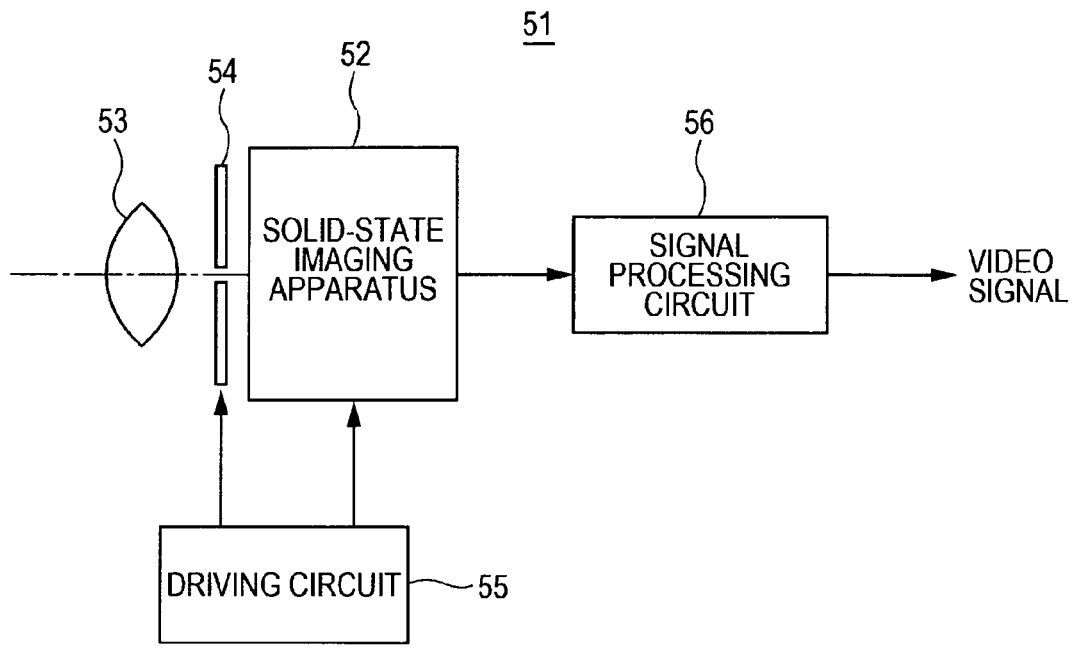
FIG. 11 is a schematic block diagram of an electronic apparatus according to a third embodiment of the present invention.
Figure 12:
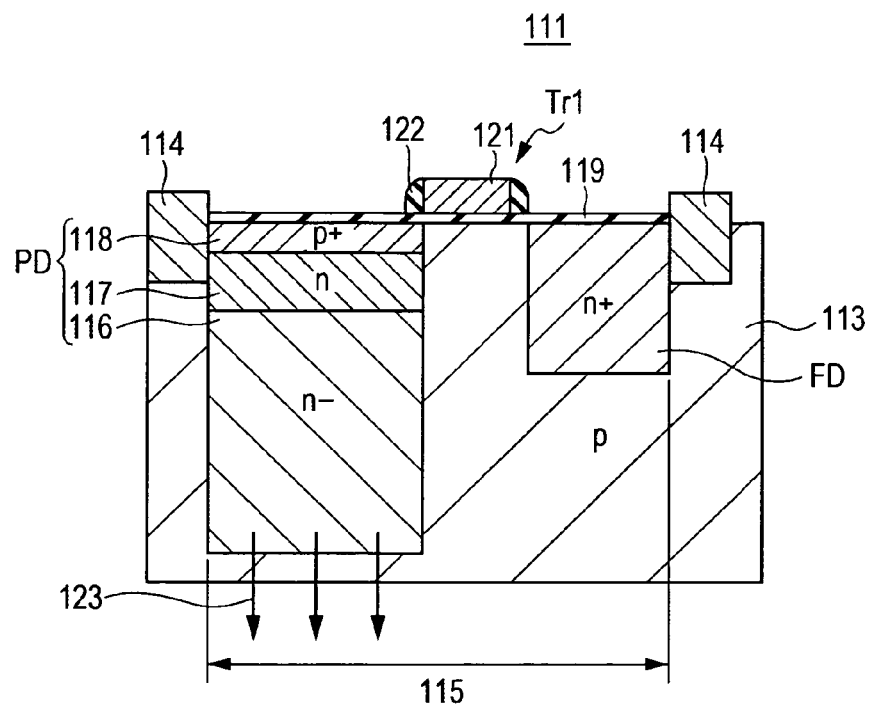
FIG. 12 is an illustration illustrating a vertical overflow structure of a CMOS solid-state imaging apparatus.
Figure 13:
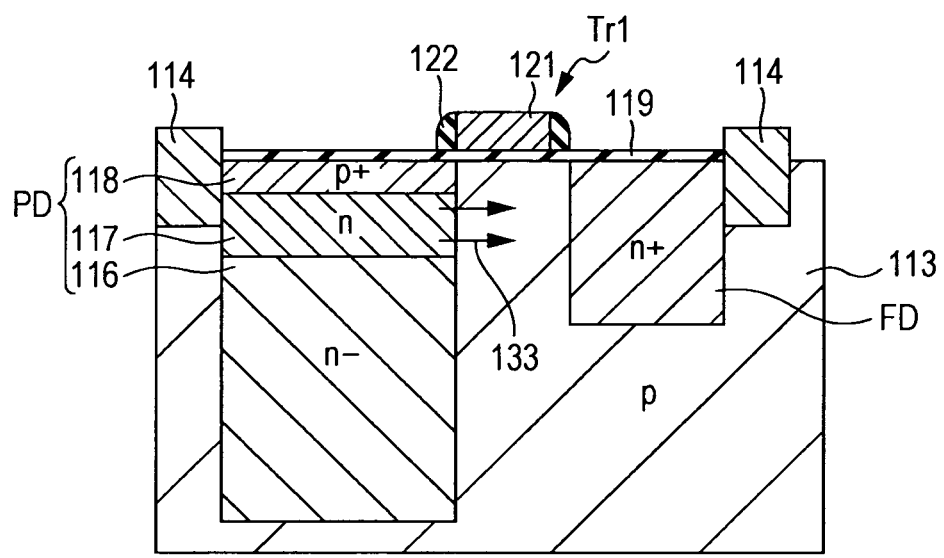
FIG. 13 is an illustration illustrating a horizontal overflow structure of a CMOS solid-state imaging apparatus.
Figure 14:
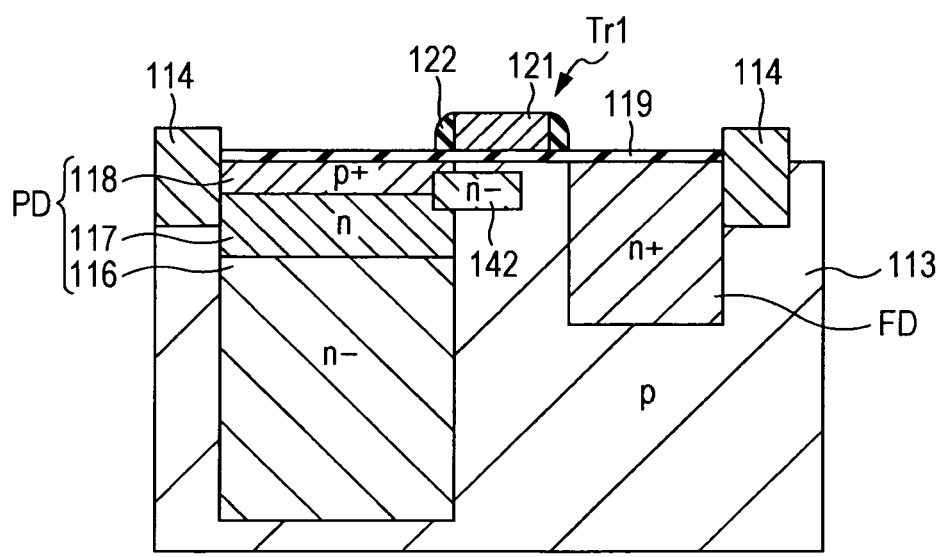
FIG. 14 is a schematic diagram showing an example of a CMOS solid-state imaging apparatus of the related art having a horizontal overflow structure of the related art.

FIG. 11 shows a third embodiment in which the present invention is applied to a camera as an example of an electronic apparatus according to the present invention. Examples of the camera according to an embodiment of the present invention include a video camera capable of capturing a moving image. A camera 51 according to the present embodiment includes a solid-state imaging apparatus 52, an optical system 53 that guides incident light to the photo-receiving sensor unit of the solid-state imaging apparatus 52, and a shutter device 54. Furthermore, the camera 51 includes a driving circuit 55 for driving the solid-state imaging apparatus 52, and a signal processing circuit 56 for processing output signals of the solid-state imaging apparatus 52.

For the solid-state imaging apparatus 52, one of the solid-state imaging apparatuses of the above-described embodiments is used. The optical system (optical lens) 53 causes image light (incident light) from a subject to be formed as an image on the image-capture plane of the solid-state imaging apparatus 52. As a result, signal charge is stored for a fixed period in the solid-state imaging apparatus 52. The optical system 53 may be an optical lens system formed of a plurality of optical lenses. The shutter device 54 controls a light irradiation period and a light-shielding period for the solid-state imaging apparatus 52. The driving circuit 55 supplies a driving signal for controlling the transfer operation of the solid-state imaging apparatus 52 and the shutter operation of the shutter device 54. The signal transfer of the solid-state imaging apparatus 52 is performed in accordance with a driving signal (timing signal) supplied from the driving circuit 55. The signal processing circuit 56 performs various signal processing operations. The video signal on which signal processing has been performed is stored on a storage medium, such as a memory, or is output to a monitor.

According to the electronic apparatus, such as a camera, according to the third embodiment, in the solid-state imaging apparatus 52 of a horizontal overflow structure, variations in the overflow barrier among pixels are suppressed, and pixel characteristics are improved. In addition, advantageous effects described in the above-described embodiments of the solid-state imaging apparatus can be obtained. Therefore, it is possible to achieve higher image quality and provide an electronic apparatus having high reliability.

The present application contains subject matter related to that disclosed in Japanese Priority Patent Application JP 2010-016000 filed in the Japan Patent Office on Jan. 27, 2010, the entire contents of which are hereby incorporated by reference.

It should be understood by those skilled in the art that various modifications, combinations, sub-combinations and alterations may occur depending on design requirements and other factors insofar as they are within the scope of the appended claims or the equivalents thereof.

What is claimed is:

1. A solid-state imaging apparatus comprising:
   a charge storage area of a second-conductivity-type between a semiconductor area of the second-conductivity-type and a first surface pinning area a first-conductivity-type, an impurity concentration of the second-conductivity-type in said semiconductor area being lower than an impurity concentration of the second-conductivity-type in said charge storage area;
   an overflow barrier of the second-conductivity-type between a second surface pinning area of the first-conductivity-type and a portion of a semiconductor well, an impurity concentration of the second-conductivity-type in said overflow barrier being lower than said impurity concentration of the second-conductivity-type in said semiconductor area;
   wherein said overflow barrier is in physical contact with a floating diffusion unit of the second-conductivity-type and said charge storage area, and
   wherein said second surface pinning area is in physical contact with said floating diffusion unit and said first surface pinning area.

2. The solid-state imaging apparatus according to claim 1, wherein a conductivity of the first-conductivity-type is opposite to a conductivity of the second-conductivity-type.

3. The solid-state imaging apparatus according to claim 1, wherein said first-conductivity-type is p-type and said second-conductivity-type is n-type.

4. The solid-state imaging apparatus according to claim 1, wherein said semiconductor well is of the first-conductivity-type.

5. The solid-state imaging apparatus according to claim 1, wherein said first surface pinning area and said second surface pinning area extend into said semiconductor well from a surface of the semiconductor well.

6. The solid-state imaging apparatus according to claim 1, wherein said charge storage area is in physical contact with said semiconductor area and said first surface pinning area.

7. The solid-state imaging apparatus according to claim 1, wherein said overflow barrier is in physical contact with said second surface pinning area and said portion of the semiconductor well.

8. The solid-state imaging apparatus according to claim 1, further comprising:

a gate insulating film between a transfer gate electrode and said second surface pinning area.

9. The solid-state imaging apparatus according to claim 8, wherein said first surface pinning area is between said charge storage area and said gate insulating film.

10. The solid-state imaging apparatus according to claim 1, wherein said portion of the semiconductor well is between said charge storage area and said floating diffusion unit.

11. The solid-state imaging apparatus according to claim 1, wherein said impurity concentration of the second-conductivity-type in said charge storage area is lower than an impurity concentration of the second-conductivity-type in said floating diffusion unit.

12. The solid-state imaging apparatus according to claim 1, wherein said semiconductor area is between a low concentration semiconductor area of the second-conductivity-type and said charge storage area.

13. The solid-state imaging apparatus according to claim 12, wherein an impurity concentration of the second-conductivity-type in said low concentration semiconductor area is lower than said impurity concentration of the second-conductivity-type in said charge storage area.

14. The solid-state imaging apparatus according to claim 12, wherein an impurity concentration of the first-conductivity-type in said portion of the semiconductor well is lower than an impurity concentration of the first-conductivity-type in said second surface pinning area.

15. The solid-state imaging apparatus according to claim 14, wherein an impurity concentration of the first-conductivity-type in said first surface pinning area is higher than said impurity concentration of the first-conductivity-type in said second surface pinning area.

16. An electronic apparatus comprising:
an optical system configured to guide incident light onto the solid-state imaging apparatus of claim 1;
a signal processing circuit configured to process a signal charge, said solid-state imaging apparatus being configured to convert said incident light into said signal charge.

* * * * *